US008350144B2

(12) United States Patent
Ramesh

(10) Patent No.: US 8,350,144 B2
(45) Date of Patent: Jan. 8, 2013

(54) HYBRID PHOTOVOLTAIC CELL MODULE

(76) Inventor: Swaminathan Ramesh, Canton, MI (US)

( * ) Notice: Subject to any disclaimer, the term of this patent is extended or adjusted under 35 U.S.C. 154(b) by 622 days.

(21) Appl. No.: 12/470,806

(22) Filed: May 22, 2009

(65) Prior Publication Data
US 2009/0288706 A1 Nov. 26, 2009

Related U.S. Application Data

(60) Provisional application No. 61/055,636, filed on May 23, 2008.

(51) Int. Cl.
*H01L 35/00* (2006.01)
*H01L 31/00* (2006.01)
(52) U.S. Cl. ............... 136/206; 136/252.2; 136/256; 136/263
(58) Field of Classification Search .......... 136/256, 136/63, 205, 206, 255, 252.2
See application file for complete search history.

(56) References Cited

U.S. PATENT DOCUMENTS

| | | | |
|---|---|---|---|
| 6,569,956 B1 | 5/2003 | Ramesh | |
| 6,657,002 B2 * | 12/2003 | Ramesh et al. | 524/602 |
| 6,849,686 B2 | 2/2005 | Michalec et al. | |
| 6,878,871 B2 | 4/2005 | Scher et al. | |
| 7,005,473 B2 | 2/2006 | Ramesh et al. | |
| 7,042,029 B2 | 5/2006 | Graetzel et al. | |
| 7,147,917 B2 | 12/2006 | Adams et al. | |
| 7,375,174 B2 | 5/2008 | Ramesh et al. | |
| 7,466,376 B2 | 12/2008 | Galvin et al. | |
| 2005/0197473 A1 | 9/2005 | Ramesh et al. | |
| 2006/0032530 A1 | 2/2006 | Afzali-Ardakani et al. | |
| 2006/0065300 A1 | 3/2006 | Enomoto et al. | |
| 2006/0102890 A1 | 5/2006 | Yamahara et al. | |
| 2006/0257637 A1 | 11/2006 | Pereira et al. | |
| 2007/0077452 A1 | 4/2007 | Liu et al. | |
| 2007/0162263 A1 | 7/2007 | Forrest | |
| 2008/0006324 A1 | 1/2008 | Berke et al. | |
| 2008/0216894 A1 | 9/2008 | Hammond | |
| 2008/0264479 A1 * | 10/2008 | Harris et al. | 136/255 |

FOREIGN PATENT DOCUMENTS

| | | | |
|---|---|---|---|
| WO | WO 9921935 A1 | 5/1999 | |
| WO | WO 03017731 A1 | 2/2003 | |
| WO | WO 2008/049577 A1 * | 5/2008 | |
| WO | WO 2008049577 A1 | 5/2008 | |
| WO | WO 2008094294 A2 | 8/2008 | |
| WO | WO 2009142763 A1 | 11/2009 | |

OTHER PUBLICATIONS

Lo et al., "Development of Dendrimers: Macromolecules for Use in Organic Light-Emitting Diodes and Solar Cells": Chemical Reviews, American Chemical Society, Apr. 2007, vol. 107, No. 4, pp. 1097-1116, XP0025362870.
Article: Venturini et al., "Optical limiting and nonlinear optical absorption properties of . . . ", J. Materials Chemistry, 2002, No. 12, pp. 2071-2076.
Article: Wang et al., "Polymers containing fullerene or carbon nanotube structures", Progress in Polymer Science, No. 29, 2004, pp. 1079-1141.
Conference Paper: Kopidakis et al., "Bulk Heterojunction Organic Photovoltaic Devices Using Dendrimers", 2005 DOE Solar Energy Technologies, Program Review Meeting, 5 pages.
Abstract: Kose, "Conjugated Dendrimers for Organic Photovoltaics", Dept. of Chemisty and Molecular Biology, Candidate Seminar, 2009, 1 page.
PCT International Search Report for application PCT/US2009/003180, dated Jul. 17, 2009, 4 pages.

* cited by examiner

*Primary Examiner* — Ling Choi
*Assistant Examiner* — Monique Peets
(74) *Attorney, Agent, or Firm* — Howard & Howard Attorneys PLLC

(57) ABSTRACT

A hybrid photovoltaic cell module includes a substrate and a photopolymer composition disposed on the substrate. The photopolymer composition includes an organic photopolymer, a plurality of nanoparticles, and a dendrimer that disperses the nanoparticles in the composition. The dendrimer has a number average molecular weight of from 300 to 10,000 g/mol and a core having a carbon atom directly bonded to $X^1$ and $X^2$ and two —$CH_2$ groups. $X^1$ is a hydrogen atom, a functional group, or a chain including a functional group. $X^2$ is a chain including a functional group that is the same or different from the functional groups of $X^1$. Each —$CH_2$ group is bonded to a chain that independently includes a functional group that is the same or different from said functional groups of $X^1$ and $X^2$. The module is formed using a method that includes the step of disposing the photopolymer composition on the substrate.

46 Claims, 9 Drawing Sheets

HYBRID PHOTOVOLTAIC CELL MODULE

CROSS-REFERENCE TO RELATED APPLICATION

The subject patent application claims priority to, and all the benefits of, U.S. Provisional Patent Application Ser. No. 61/055,636 filed on May 23, 2008. The entirety of this provisional patent application is expressly incorporated herein by reference.

FIELD OF THE INVENTION

The present invention generally relates to a hybrid photovoltaic cell module. More specifically, the hybrid photovoltaic cell module comprises a substrate and a photopolymer composition that includes a dendrimer and that is disposed on the substrate. The present invention also relates to a method of forming the photovoltaic cell module.

DESCRIPTION OF THE RELATED ART

Solar cells, also known as photovoltaic cells or "excitonic photovoltaic cells," are semiconductor devices used to convert light into electricity. Photovoltaic cell modules typically include substrates and photovoltaic cells bonded to the substrates. The photovoltaic cell modules are generally used in outdoor applications to collect light and are commonly referred to as "solar panels." Photovoltaic cells and photovoltaic cell modules perform two primary functions. A first function is photogeneration of charge carriers such as electrons and holes in light absorbing materials. The second function is direction of the charge carriers to a conductive contact to transmit electricity.

As is known in the art, photovoltaic cells generate electricity through light absorption, exciton dissociation, and charge transport. The photovoltaic cells typically include semiconductors that collect and absorb light and produce excitons. Excitons include bound states of electrons and imaginary particles (electron holes) that are formed in the semiconductors. Light typically enters the photovoltaic cells and strikes the semiconductor thereby exciting electrons from valence bands of the semiconductor into conduction bands of the semiconductor. The electrons that move from the valence bands to the conductor bands leave behind electron holes of opposite electric charge, to which the electrons are attracted by Coulombic attraction forces. Ideally, the electrons dissociate from the electron holes through charge transport with conductive contacts that are less than 10 nm from the electrons. This generates electricity and current flow. If the electrons and the electron holes recombine (exciton recombination) or if the semiconductor is restored to its original oxidation level (back electron transfer), generation of electricity is reduced and efficiency of the photovoltaic cell is reduced, as shown in FIG. 1.

There are four general types (i.e., generations) of photovoltaic cells that are known in the art. First generation photovoltaic cells typically include single crystal and/or polycrystalline silicon or other inorganic molecules. These types of photovoltaic cells are used in a majority of photovoltaic cell applications and have efficiencies up to about ~31% by Shockley Queisser limit. However, these types of photovoltaic cells are expensive to produce due to an inherent cost of processing, handling silicon, and fabrication.

Second generation photovoltaic cells, also known as thin film cells, are typically based on thin epitaxial deposits of semiconductors on lattice-matched wafers. These semi-conductors usually include amorphous silicon, polycrystalline silicon, micro-crystalline silicon, cadmium telluride, and copper indium selenide/sulfide. Theoretically, thin film cells have reduced mass, as compared to their first generation counterparts, thereby allowing these cells to be used with light and flexible materials. They can also be formed at low cost and with relative manufacturing ease. However, the second generation photovoltaic cells are not as efficient (~9% efficiency) as the first generation photovoltaic cells.

Third and fourth generation photovoltaic cells are typically based on organic photopolymers and are also known as "hybrid photovoltaic cells." The organic photopolymers act as "pseudo-semiconductors" and conduct electricity. The third generation photovoltaic cells can be produced at a lower cost than the first and second generation photovoltaic cells, can be more easily formed into specific shapes and sizes, and are typically lighter than their counterparts. However, the third generation photovoltaic cells typically exhibit poor efficiency of from 1-3%.

Fourth generation photovoltaic cells typically include organic photopolymers and also typically includes nanoparticles such as quantum dots and carbon nanotubes, which increase the efficiency and performance of these photovoltaic cells. More specifically, fourth generation photovoltaic cells that include quantum dots and carbon nanotubes can be more efficient as compared to third generation photovoltaic cells but still have a maximum efficiency of about 5-6%. Quantum dots allow for multiple exciton generation which increases an amount of light absorbed. Carbon nanotubes increase a conversion efficiency and electrical conductivity of the photovoltaic cells by conducting electrons away from the organic photopolymers and thereby reducing exciton recombination. However, when used in these types of photovoltaic cells, the nanoparticles tend to agglomerate and are not maximally efficient, as shown in FIGS. 2 and 3.

The aforementioned photovoltaic cells vary in efficiency, usefulness, and cost. Although the third and fourth generation photovoltaic cells typically are lighter and more flexible that their counterparts, these photovoltaic cells are not as efficient as the first generation photovoltaic cells. Thus, there remains an opportunity to develop an improved hybrid photovoltaic cell that is both efficient and useful. There also remains an opportunity to develop such a hybrid photovoltaic cell in a cost effective manner.

SUMMARY OF THE INVENTION AND ADVANTAGES

The instant invention provides a hybrid photovoltaic cell module that includes a substrate and a photopolymer composition disposed on the substrate. The photopolymer composition includes an organic photopolymer, a plurality of nanoparticles, and a dendrimer that disperses the plurality of nanoparticles in the photopolymer composition. The dendrimer has a number average molecular weight of from 300 to 10,000 g/mol and a core having the general formula:

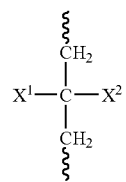

In this formula, $X^1$ is a hydrogen atom, a functional group, or a chain including a functional group. Also in this formula, $X^2$ is a chain including a functional group that is the same or different from the functional groups of $X^1$. Furthermore, each —$CH_2$ group of the core is bonded to a chain. Each chain independently includes a functional group that is the same or different from said functional groups of $X^1$ and $X^2$. The hybrid photovoltaic cell module is formed using a method that includes the step of disposing the photopolymer composition on the substrate.

The dendrimer in the photopolymer composition interacts with the organic photopolymer and the plurality of nanoparticles thereby maximizing homogeneous distribution of the nanoparticles within the photopolymer composition. Increased homogeneous distribution, i.e., increased dispersion of the plurality of nanoparticles, amplifies light absorption, exciton dissociation, and charge transport and leads to increased light conversion efficiency. Additionally, the dendrimer minimizes exciton recombination and back electron transfer which also contributes to the increased efficiency. Overall, the dendrimer allows the hybrid photovoltaic cell module to exhibit a greater than 50% increase in light conversion efficiency as compared to its predecessors. The hybrid photovoltaic cell module also has a minimized weight, is produced with decreased production costs, and operates over a wide range of temperatures and in a variety of radiation environments.

BRIEF DESCRIPTION OF THE SEVERAL VIEWS OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 12:
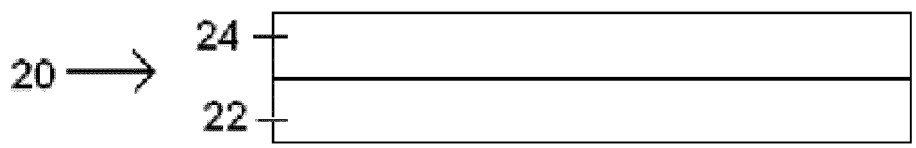
FIG. 12 is a side view of a first hybrid photovoltaic cell module of the instant invention including the substrate and the photopolymer composition disposed on the substrate.

The present invention provides a hybrid photovoltaic cell module (20) (hereinafter referred to as "module") generally shown in FIGS. 12-14 and a method of forming the module (20). As is known in the art, modules (20) typically include silicon. Thus, the terminology "hybrid," as used herein, means that the module (20) includes at least one organic photopolymer, as described in detail below. It is contemplated that the module (20) may include silicon or may be free of silicon. Typically, the module (20) is free of silicon such as amorphous silicon, monocrystalline silicon, polycrystalline silicon, microcrystalline silicon, and nanocrystalline silica The module (20) can be used in any industry including, but not limited to, electronics, power generation systems, satellites, automobiles, batteries, photoelectrochemical applications, polymer solar cell applications, nanocrystal solar cell applications, and dye-sensitized solar cell applications. In one embodiment, a series of modules (20) are electrically connected and form a photovoltaic array. Photovoltaic arrays are typically used on rooftops or in automobiles and may be connected to battery backups and/or DC pumps. The photovoltaic array of the instant invention may be planar or non-planar and typically functions as a single electricity producing unit wherein the modules (20) are interconnected in such a way as to generate voltage, such as in a parallel circuit.

Referring specifically to the module (20), the module (20) includes a substrate (22) which may include any suitable material known in the art. The substrate (22) may provide protection to a front and/or rear surface of the module (20). The substrate (22) may be of any rigidity and may be soft or stiff, flexible or rigid. Alternatively, the substrate (22) may simultaneously include rigid and flexible segments. The substrate (22) may be transparent to light, impervious to light, or may be opaque. In one embodiment, the substrate (22)

includes glass. Alternatively, the substrate (22) may include one or more plastics, metal foils, polyimides, polyesters, polyolefins, nylons, polycarbonates, polyamides, ethylene-vinyl acetate copolymers, organic fluoropolymers, spin castable or moldable plastics, and combinations thereof.

The substrate (22) may be load bearing or non load bearing and may be included in any portion of the module (20). Typically, the substrate (22) is load bearing. The substrate (22) may be a top and outermost layer and/or a bottom and outermost layer of the module (20). Alternatively, the substrate (22) may be an interior layer. Bottom layers typically serve as mechanical support for the module (20), as shown in FIGS. 12-14. Alternatively, the module (20) may include a substrate (22) and a second substrate (not shown). The second substrate may be the same or different than the substrate (22). In one embodiment, the substrate (22) is the bottom layer and the second substrate is a top layer (e.g. a superstrate). Typically, at least one of the substrates is transparent to sunlight and is positioned in front of a light source. The substrate (22) may provide protection from environmental conditions such as rain, snow, and heat. The substrate (22) may also include a protective layer of polypropylene or polybutylene disposed thereon.

In addition to the substrate (22), the module (20) also includes a photopolymer composition (24) disposed on the substrate (22). The photopolymer composition (24) may be disposed on the substrate (22) and be in direct contact with the substrate (22) or be spaced apart from (i.e., not in direct contact with) the substrate (22) while remaining "disposed on" the substrate (22). The module (20) may include multiple layers of the photopolymer composition (24), e.g. first and second and/or third layers of the photopolymer composition (24). Second, third, and/or any additional layers of the photopolymer composition (24) may be the same or different from the photopolymer composition (24) described above. The additional layers of the photopolymer composition (24) may also be disposed on the substrate (22). In various embodiments, the photopolymer composition (24) and/or any additional layers of the photopolymer composition (24) are present in a thickness of from 0.1 to 200 micrometers, of from 1 to 100 micrometers, of from 1 to 75 micrometers, of from 1 to 50 micrometers, of from 10 to 75 micrometers, of from 10 to 50 micrometers, of from 10 to 40 micrometers, of from 10 to 30 micrometers, of from 10 to 20 micrometers, of from 20 to 50 micrometers, of from 20 to 40 micrometers, or of from 20 to 30 micrometers. In one embodiment, the photopolymer composition (24) is disposed on the substrate (22) in a thickness of from about 0.1 to about 3 mils. Without intending to be bound by any particular theory, it is believed that minimizing the thickness of the photopolymer composition (24) may maximize efficiency of the module (20). Of course, the instant invention is not limited to the aforementioned thicknesses.

The photopolymer composition (24) may be transparent to UV and/or visible light while any second (or additional) layers of the photopolymer composition (24) may be transparent to light, impermeable to light or opaque. The photopolymer composition (24) may be disposed on the substrate (22) in any amount and size. The photopolymer composition (24) includes an organic photopolymer, a plurality of nanoparticles, and a dendrimer. In one embodiment, the photopolymer composition (24) consists essentially of the organic photopolymer, the plurality of nanoparticles, and the dendrimer and does not include any compounds that materially affect the basic and novel characteristic of the photopolymer composition (24) and/or the module (20) such as metals. In another embodiment, the photopolymer composition (24) consists of the organic photopolymer, the plurality of nanoparticles, and the dendrimer.

Referring to the organic photopolymer, the terminology "photopolymer" includes any organic polymer that generates electrons when struck with light energy, whether visible, infrared, UV, IR, etc. In one embodiment, the organic photopolymer is selected from the group of poly(3-octylthiophene), poly(phenylenevinylene), poly(3-hexylthiophene), polyanilines, and combinations thereof. Preferably, the organic photopolymer includes poly(3-hexylthiophene). Of course, the instant invention is not limited to these photopolymers and may include any organic photopolymer known in the art. The photopolymer composition (24) typically includes the organic photopolymer in an amount of from 1 to 99 parts by weight per 100 parts by weight of the photopolymer composition. In other embodiments, the organic photopolymer is present in amounts of from 1 to 99.9, from 2 to 98, from 3 to 97, from 4 to 96, from 5 to 95, from 6 to 94, from 7 to 93, from 8 to 92, from 9 to 91, or from 10 to 90, parts by weight per 100 parts by weight of the photopolymer composition (24).

Referring now to the plurality of nanoparticles, it is believed that the chemical composition and size of the nanoparticles determine what types (i.e., wavelengths) of light are absorbed by the module (20). Typically, the organic photopolymer and/or the photopolymer composition (24) is "doped" with the nanoparticles. The plurality of nanoparticles may include inorganic nanoparticles, organic nanoparticles, and combinations thereof. In one embodiment, the plurality of nanoparticles consists essentially of inorganic nanoparticles and does not include organic nanoparticles. In another embodiment, the plurality of nanoparticles consists of inorganic nanoparticles. In yet another embodiment, the plurality of nanoparticles consists essentially of organic nanoparticles and does not include inorganic nanoparticles. In still another embodiment, the plurality of nanoparticles consists of organic nanoparticles. Typically, the plurality of nanoparticles includes both inorganic and organic nanoparticles. In various embodiments, the plurality of nanoparticles includes inorganic and/or organic nanoparticles are independently present in amounts of less than 50, more typically in amounts of less than 20, still more typically in amounts of less than 10, and most typically in amounts of less than 5, parts by weight per 100 parts by weight of the photopolymer composition (24).

In other embodiments, the plurality of nanoparticles is present in amounts of from 0.1 to 10, from 1 to 10, from 2 to 10, from 1 to 5, or from 2 to 5, parts by weight per 100 parts by weight of the photopolymer composition (24). In still other embodiments, the plurality of nanoparticles includes inorganic and organic nanoparticles that are present in a ratio of from 0.05:1 to 1:2, in a ratio of 0.1:1, in a ratio of 1:2, in a ratio of 1:5, in a ratio of 1:10, in a ratio of 1:1, or in any ratio therebetween the aforementioned values. Each of the aforementioned ratios is of the inorganic nanoparticles to the organic nanoparticles.

In one embodiment, the inorganic nanoparticles are selected from the group of titanium dioxide ($TiO_2$), cadmium sulfide (CaS), cadmium selenide (CaSe), cadmium telluride (CdTe) and combinations thereof. In other embodiments, the inorganic nanoparticles may include, but are not limited to, $CuInS_2$, $TiO_2$, CdTe, ZnO, $Al_2O_3$, $Fe_2O_3$, $Ge^0$, SiC, $SrTiO_3$, InP, CdSe, CdS, PbS, and combinations thereof. The inorganic nanoparticles may be further defined as quantum dots. As is known in the art, quantum dots are semiconductor nanostructures that confine motion of conduction band electrons, valence band holes, and/or excitons (i.e., bound pairs of conduction band electrons and valence band holes) in three spatial directions. Typically, the quantum dots include finite numbers (from 1-100) of conduction band electrons, valence band holes, or excitons, and thereby have a finite number of elementary electric charges. Most typically, the quantum dots include nano-sized $TiO_2$. Preferably, the quantum dots have a band gap of from 0.7 to 3.8 eV and most preferably of about 1.5 eV to optimize light absorption and electricity production. The quantum dots also preferably range in size of from 1 to 600 nanometers. Of course, the instant invention is not limited to the aforementioned inorganic nanoparticles and may include any inorganic nanoparticles known in the art.

Referring now to the organic nanoparticles, these nanoparticles typically include carbon nanotubes (CNTs). Carbon nanotubes are allotropes of carbon that have a nanostructure in which a length-to-diameter ratio exceeds 1,000,000. As known in the art, carbon nanotubes are typically cylindrical fullerenes having at least one end capped with a hemisphere of a "buckyball." Carbon nanotubes can range in size from nanometers to millimeters and may be single walled or multi-walled. Other allotropic forms of nano-sized carbon such as fullerenes and carbon sheets, etc may also be used. Without intending to be bound by any particular theory, it is believed that, in this invention, the organic photopolymer acts as an electron donor while the plurality of nanoparticles act as electron acceptors, thus allowing an electrical current to be generated. More specifically, it is believed that the organic photopolymer of the instant invention produces electron-hole pairs. The carbon nanotubes are believed to transport the electrons away from the holes to minimize recombination and generate a photovoltaic effect. Of course, the instant invention is not limited to the aforementioned organic nanoparticles and may include any organic nanoparticles known in the art. Without intending to be bound by any particular theory, it is believed that increased efficiency and absorption of the module of this invention can be attributed, at least in part, to distribution and interaction between the plurality of nanoparticles and the photopolymer composition (24). It is believed that the presence of the plurality of nanoparticles lowers the absorption of the photopolymer composition (24) due to a disordered matrix. Improved ordering is believed to maintain interactions among polymer chains and improve absorption effectiveness of this invention.

In various embodiments, the photopolymer composition (24) is free of, or substantially free of, fullerenes such as Buckey Balls. In one embodiment, the photopolymer composition is entirely free of fullerenes. In another embodiment, the terminology "substantially free of" refers to an amount of fullerenes present in the photopolymer composition (24) of less than 500, more typically of less than 100, still more typically of less than 50, and most typically of less than 10, parts by weight per one million parts by weight of the photopolymer composition (24). In other embodiments, the photopolymer composition (24) includes fullerenes but the dendrimer is not covalently bonded to any of the fullerenes.

In one alternative embodiment, the dendrimer is free of covalent bonds to a fullerene. In another alternative embodiment, the central core of the dendrimer is free of covalent bonds to a fullerene. In still other embodiments, the central core of the dendrimer and/or one or more "chains" of the dendrimer is covalently bonded to a fullerene. As is known in the art, and as used in the instant invention, the terminology "fullerene" includes a family of carbon allotropes in the form of hollow spheres, ellipsoids, tubes, and/or plane, as is known in the art.

Referring now to the dendrimer, the terminology "dendrimer" refers to a repeatedly branched molecule. Dendrimers may also be known as cascade type molecules or arborols. Typically, dendrimers are repeatedly branched, approximately monodisperse, and highly symmetric compounds. Dendrimers can be formed by any process known in the art but are typically formed in one of two ways. A first way is known in the art as a "divergent" method and includes successively attaching one branching unit after another to the core to achieve a multiplication of peripheral groups. Typically, this first way is limited by steric effects. The second way, also known in the art as a "convergent" method includes constructing the dendrimer from outside in, i.e., from end groups towards the core. The dendrimer of the instant invention may be formed by one or both aforementioned methods and/or by any other method known in the art. In one embodiment, the dendrimer is further defined as a star-polymer and is preferably highly branched. In the instant invention, the dendrimer is also known as a "dispersant dendrimer" and is thought to disperse the plurality of nanoparticles within the photopolymer composition (24).

Preferably, the dendrimer has nano-scale dimensions. In various embodiments, the dendrimer has an approximately spherical three-dimensional structure and has an approximate diameter of from 10 to 200, from 30 to 100, or from 50 to 100, nanometers. In other embodiments, the dendrimer has an approximately conical three-dimensional structure, and has an approximate height of from 10 to 200, from 30 to 100, or from 50 to 100, nanometers, as measured from an apex of the cone to an arc of the cone. In still other embodiments, the dendrimer has an approximate length of from 10 to 200, from 30 to 100, or from 50 to 100, nanometers, as measured from one end of the dendrimer to another.

The dendrimer of the instant invention has a central core (i.e., a core). Typically, the core includes a tertiary or quaternary central carbon atom. However, it is contemplated that the central carbon atom may be a secondary carbon atom. In one embodiment, the core has the following general formula:

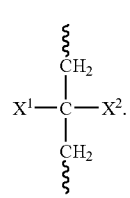

In this embodiment, $X^1$ is a hydrogen atom, a functional group, or a chain including a functional group. Also in this embodiment, $X^2$ is a chain including a functional group that is the same or different from the functional groups of $X^1$. Furthermore, in this embodiment, each $—CH_2$ group of the central core is bonded to a chain. Each chain in this embodiment independently includes a functional group that is the same or different from the functional groups of $X^1$ and $X^2$.

In another embodiment, the core has the following general formula:

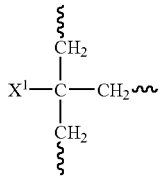

In this embodiment, $X^1$ is a hydrogen atom, a functional group, or a chain including a functional group. Furthermore, in this embodiment, each —$CH_2$ group is bonded to a chain and each chain independently comprises a functional group that is the same or different from the functional groups of $X^1$.

In still another embodiment, the dendrimer has a number average molecular weight of from 300 to 10,000 g/mol, a polydispersity of from 1 to 1.2, and a core having the general formula:

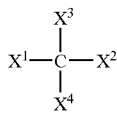

wherein each of $X^1$ to $X^4$ is a hydrogen atom, a functional group, or a chain comprising one or more functional groups that may be the same or different from each other.

The functional group(s) of $X^1$, $X^2$, $X^3$, $X^4$, and/or the chains may be any known in the art. The functional group(s) typically include, but are not limited to, alkanes, alkene, alkynes, benzene derivatives, toluene derivatives, haloalkanes, acyl halides, anhydrides, alcohols, ketones, aldehydes, carbonates, carboxylates, carboxylic acids, ethers, esters, peroxides, amides, amines, imines, imides, azides, azo compounds, cyanates, isocyanates, nitrates, nitro compounds, nitroso compounds, pyridine derivatives, phosphines, phosphodiesters, phosphonic acid, phosphates, sulfides, sulfones, sulfonic acid, sulfoxides, thiols, thiocyanates, disulfides, and combinations thereof. In various embodiments, one or more of the functional group(s) of $X^1$, $X^2$, $X^3$, $X^4$, and/or the chains are selected from the group of a nitrogen-containing functional group, a phosphorous-containing functional group, a sulfur-containing functional group, and an oxygen-containing functional group. In another embodiment, one or more of the functional group(s) of $X^1$, $X^2$, $X^3$, $X^4$, and/or the chains are independently selected from the group of an aliphatic functional group having at least 4 carbon atoms, an alcohol functional group, and an ester functional group. It is contemplated in this invention that an alcohol functional group may be represented at R—OH wherein R may be a carbonyl group or a saturated/unsaturated carbon atom. In other words, the dendrimer may include an —OH group attached to a carbonyl carbon (C=O). This type of alcohol functional group is also known as a carboxylic acid. Alternatively, the alcohol functional group may be represented as R—O and may not include an attached hydrogen atom. Typically, the alcohol functional group includes —OH and is also known in the art as a hydroxyl group.

In one embodiment, the functional group of each chain bonded to the —$CH_2$ groups of the core is independently selected from the group of an aliphatic functional group having at least 4 carbon atoms, an alcohol functional group, and an ester functional group. In another embodiment, the functional group of $X^2$ is selected from the group of an aliphatic functional group having at least 4 carbon atoms, an alcohol functional group, and an ester functional group. In still another embodiment, the functional group of $X^2$ is selected from the group of a nitrogen-containing functional group, a phosphorous-containing functional group, a sulfur-containing functional group, and an oxygen-containing functional group. In still other embodiments, one or more of the $X^1$, $X^2$, and/or the chains are further comprise two additional functional groups which are each the same or different from the functional group of $X^2$. In one embodiment, each of the two additional functional groups of $X^2$ are independently selected from the group of an aliphatic functional group having at least 4 carbon atoms, an alcohol functional group, and an ester functional group. In a further embodiment, $X^1$ is a chain, as described above, and the functional group of the chain is selected from the group of an aliphatic functional group having at least 4 carbon atoms, an alcohol functional group, and an ester functional group. In another embodiment, the chain (of $X^1$) further comprises two additional functional groups which are each the same or different from the functional groups of $X^1$. In this embodiment, each of the two additional functional groups are independently selected from the group of an aliphatic functional group having at least 4 carbon atoms, an alcohol functional group, and an ester functional group.

Figure 8:
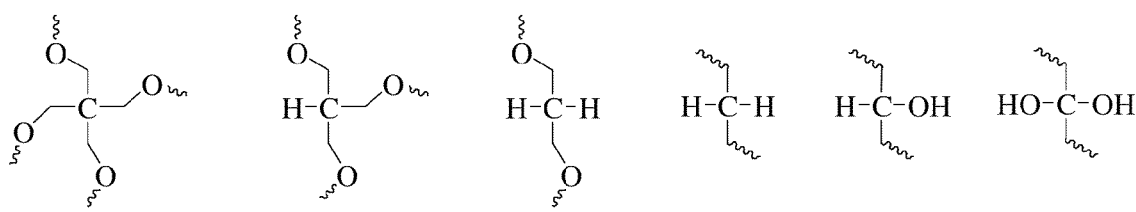
FIG. 8 illustrates various non-limiting embodiments of the central core of the dendrimer of the instant invention.

In one alternative embodiment, each —$CH_2$ group is directly bonded to an oxygen atom, as set forth in FIG. 8. In another alternative embodiment, each —$CH_2$ group is directly bonded to an oxygen atom and $X^2$ includes a —$CH_2$—O group directly bonded to the central carbon atom of the core, as also set forth in FIG. 8. In still another embodiment, $X^1$ is a chain and the chain includes a —$CH_2$—O group directly bonded to the central carbon atom of the core. In yet another embodiment, at least one of the chains bonded to the —$CH_2$ groups has the general chemical structure:

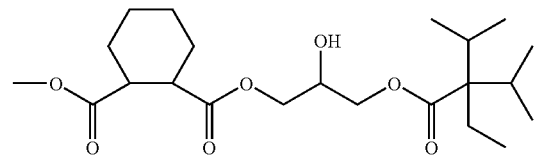 [SMILES: CCC(C(=O)OCC(O)COC(=O)C1CCCCC1C(=O)OC)(C(C)C)C(C)C]

Figure 9:
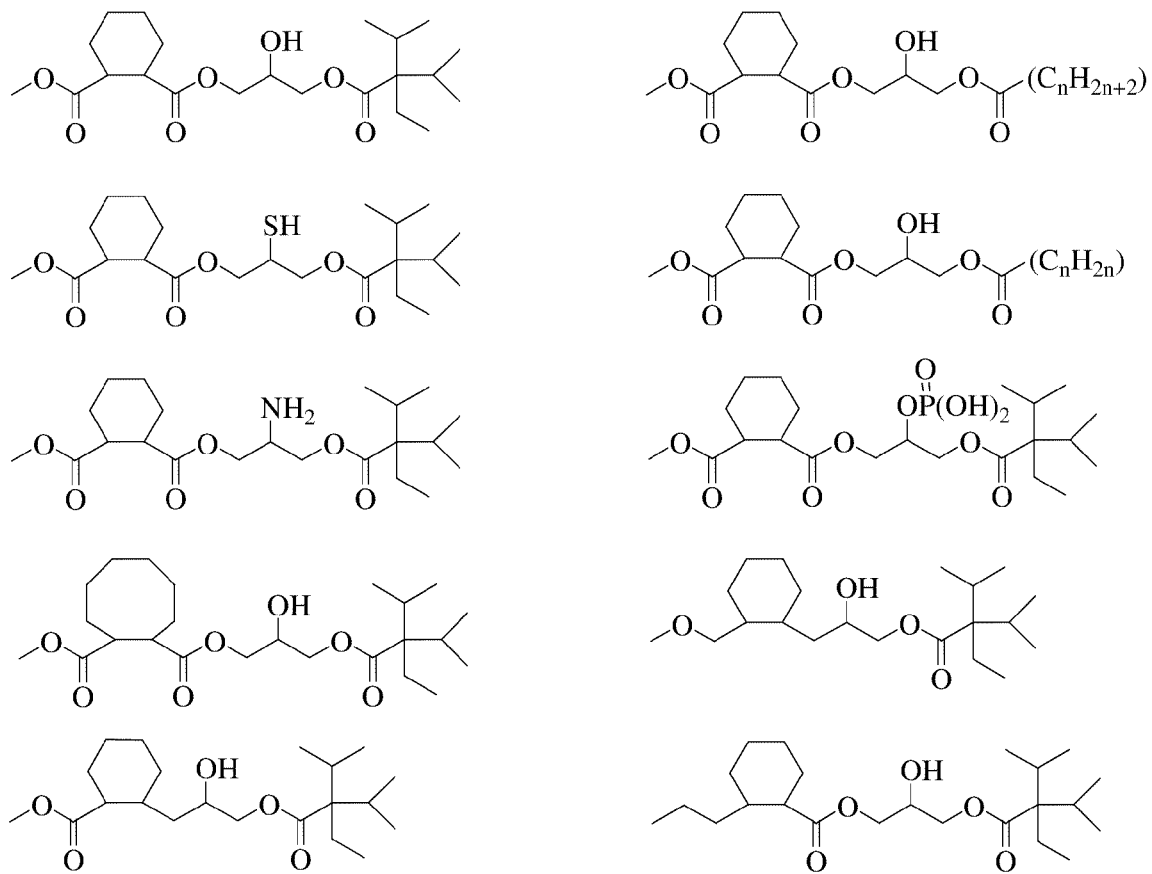
FIG. 9 illustrates various non-limiting embodiments of $X^1$, $X^2$, and/or the chains of the dendrimer of the instant invention.

In various embodiments, it is contemplated that that both and/or all of the chains bonded to the —$CH_2$ groups and/or any chains of $X^1$ and $X^2$ may be, or may include, the general chemical structures set forth in FIG. 9. Of course, the instant invention is not limited to these chemical structures. It is also contemplated that both and/or all of the chains bonded to the —$CH_2$ groups have the aforementioned general chemical structure, as set forth in FIG. 10. In one alternative embodiment, $X^2$ has the aforementioned general chemical structure. In still another embodiment, dendrimer has the following general chemical structure, as also set forth in FIG. 10:

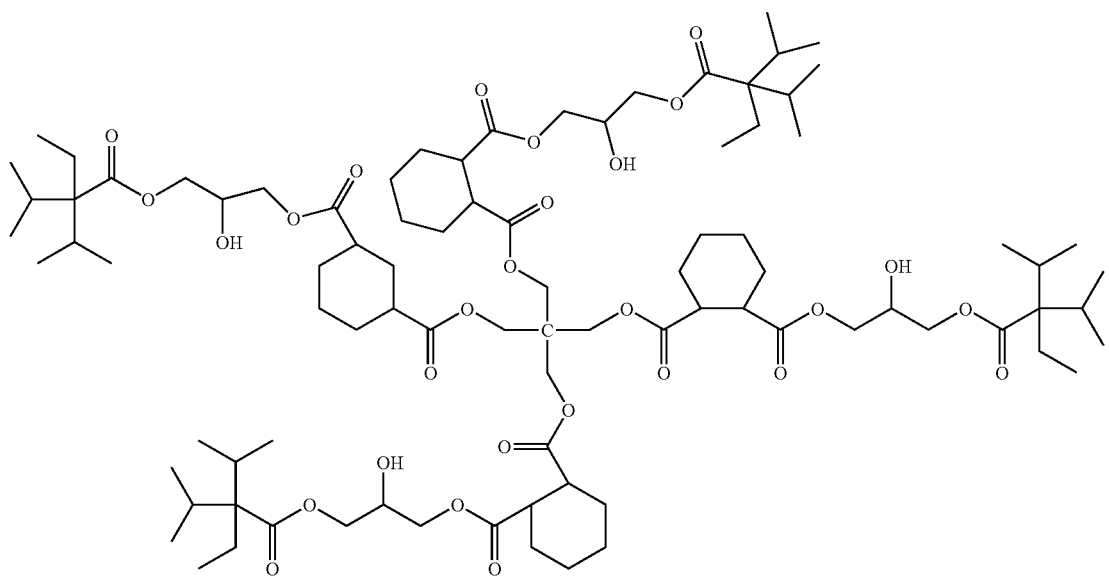 [SMILES: CCC(C(=O)OCC(O)COC(=O)C1CCCC(C(=O)OCC(COC(=O)C2CCCCC2C(=O)OCC(O)COC(=O)C(CC)(C(C)C)C(C)C)(COC(=O)C2CCCCC2C(=O)OCC(O)COC(=O)C(CC)(C(C)C)C(C)C)COC(=O)C2CCCCC2C(=O)OCC(O)COC(=O)C(CC)(C(C)C)C(C)C)C1)(C(C)C)C(C)C]

Figure 10A:
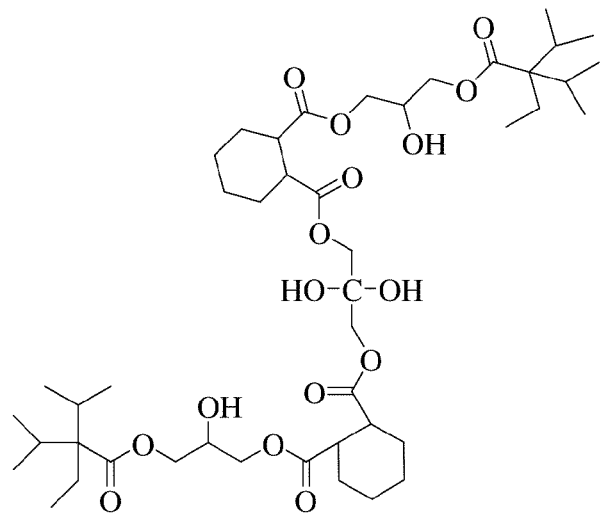
FIG. 10*a* illustrates one non-limiting embodiment of the dendrimer of the instant invention.
Figure 10B:
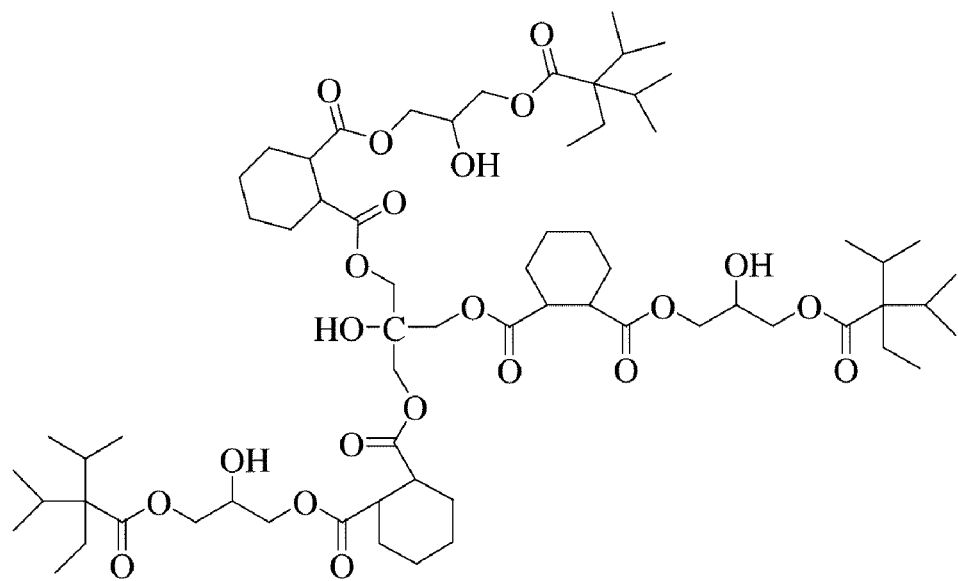
FIG. 10*b* illustrates another non-limiting embodiment of the dendrimer of the instant invention.
Figure 10C:
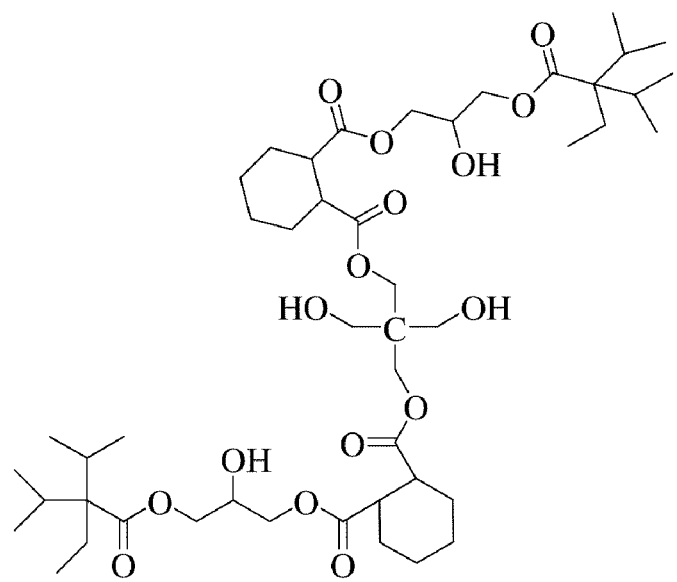
FIG. 10*c* illustrates yet another non-limiting embodiment of the dendrimer of the instant invention.
Figure 10D:
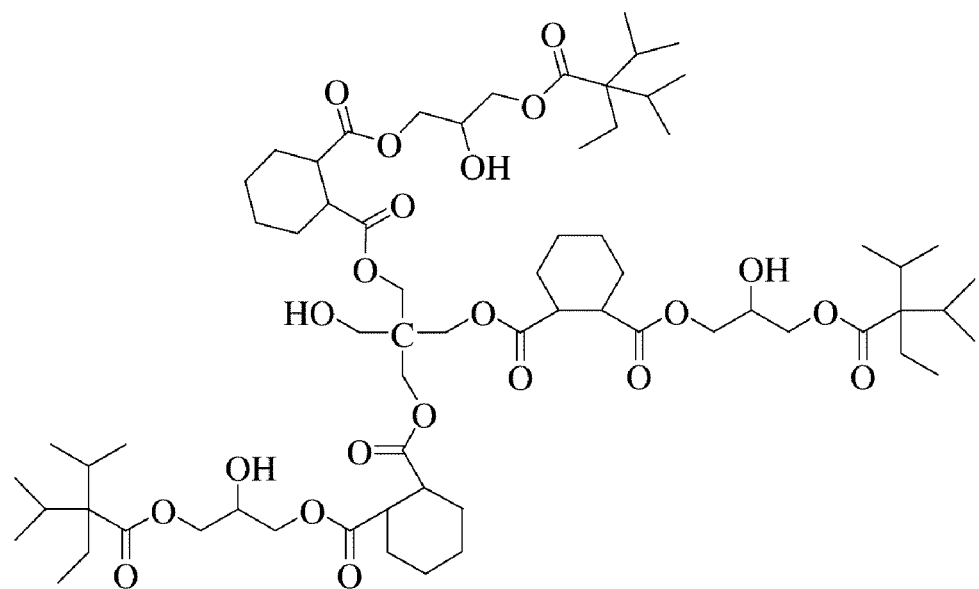
FIG. 10*d* illustrates still another non-limiting embodiment of the dendrimer of the instant invention.
Figure 10E:
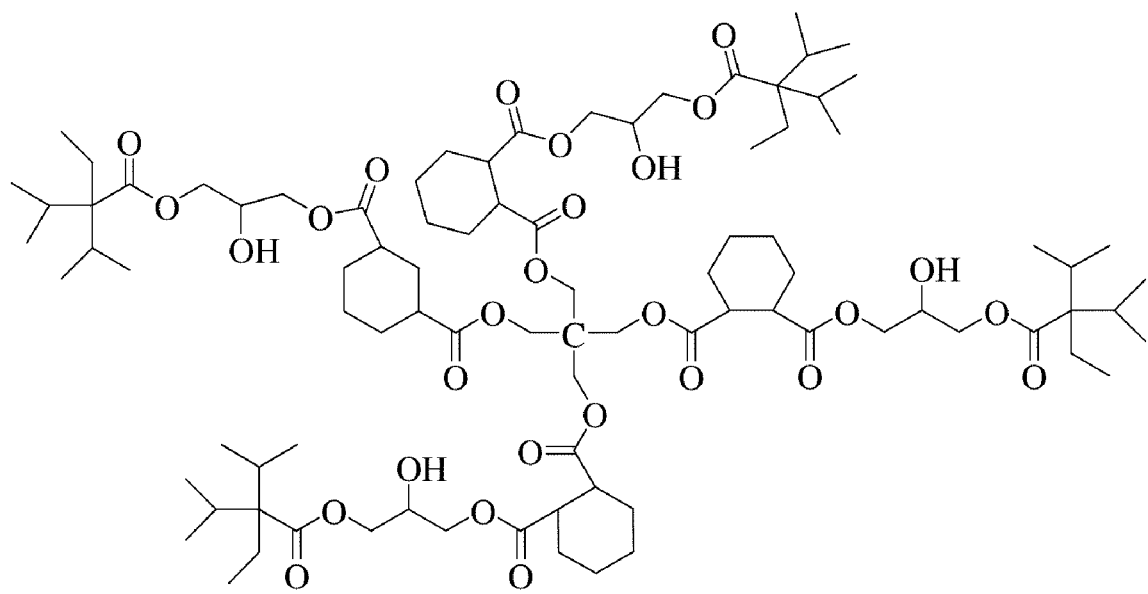
FIG. 10*e* illustrates yet another non-limiting embodiment of the dendrimer of the instant invention.
Figure 10F:
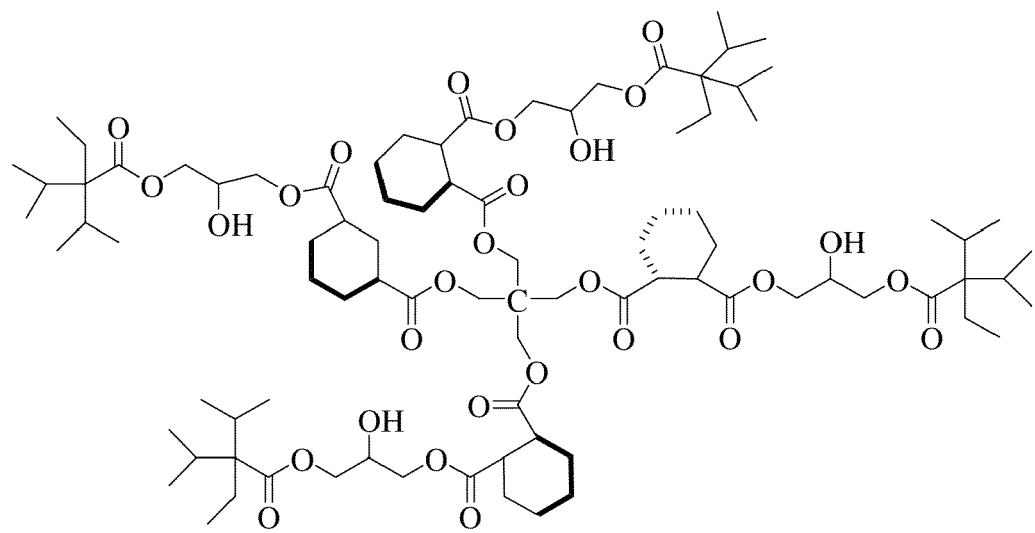
FIG. 10*f* illustrates the dendrimer of FIG. 10*e* including stereochemistry.

In one embodiment, the dendrimer has the general chemical structure, including stereochemistry, as set forth in FIG. 10f.

Typically, the dendrimer includes hydroxyl groups, ester groups, and/or alkyl groups. In one embodiment, the dendrimer includes one or more hydroxyl groups, thiol groups, amine ($NH_2$) groups, and/or acid groups. In another embodiment, the dendrimer has multiple chains and at least two of the chains are conductive resulting from polyaniline or poly-3-hexylthiophene chain attachments. In still another embodiment, the dendrimer includes one or more chains bonded to an electrically conducting compound such as poly(3,4-ethylene dioxy thiophene) (PEDOT) or a polyaniline. Typically, electrically conducting compounds have unsaturation and aromatic character.

The dendrimer has a number average molecular weight of from 300 to 10,000, more typically of from 300 to 4,000, still more typically of from 500 to 3,000, even more typically of from 500 to 1,500, and most typically of from 1,000 to 1,500 g/mol. The dendrimer also typically has a weight average molecular weight of from 350 to 12,000, more typically of from 350 to 4,800, still more typically of from 600 to 3,600, even more typically of from 600 to 1,800, and most typically of from 1,200 to 1,800, g/mol. The dendrimer also typically has a polydispersity of from 1 to 1.5, more typically of from 1 to 1.4, still more typically of from 1 to 1.3, and most typically of from 1 to 1.2. In various embodiments, the dendrimer is present in an amount of from 0.1 to 10, from 1 to 10, from 2 to 10, from 1 to 5, or from 2 to 5, parts by weight per 100 parts by weight of the photopolymer composition (24). In one embodiment, the dendrimer is present in the photopolymer composition (24) in a ratio of from 0.05:1 to 1:1 of the dendrimer to the organic photopolymer.

Figure 1:
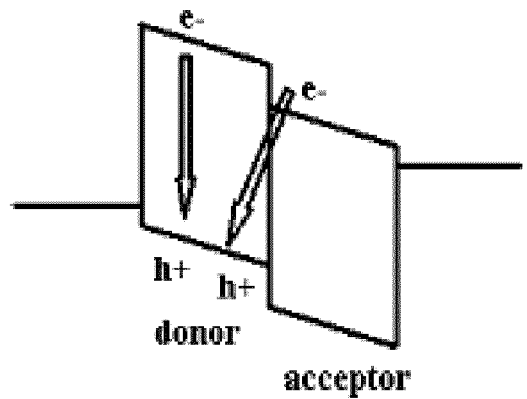
FIG. 1 illustrates exciton recombination and back electron transfer which reduce light conversion efficiency in a prior art photovoltaic cell.
Figure 2:
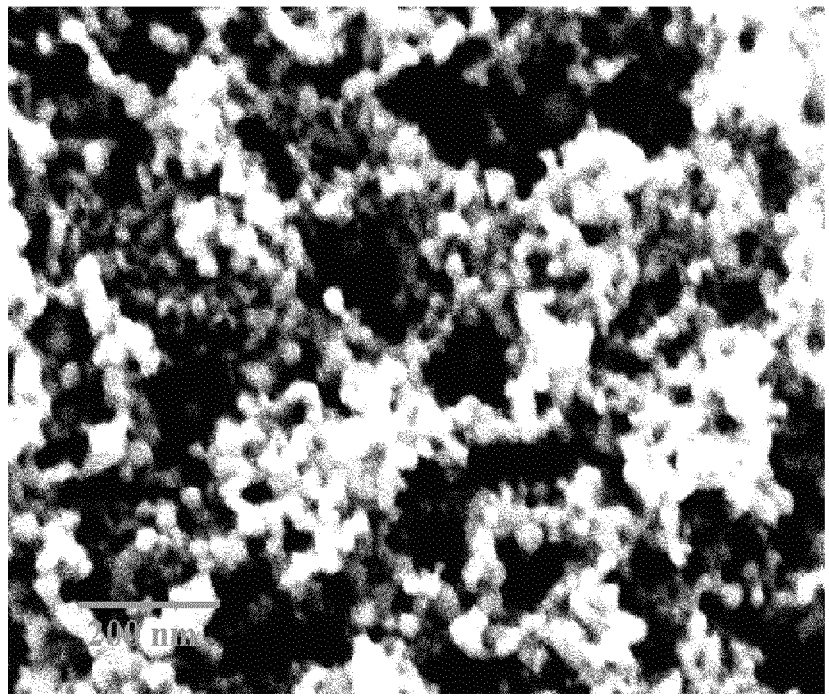
FIG. 2 is an electron scanning micrograph at 60,000 times magnification showing a prior art photopolymer composition including a plurality of nanoparticles (e.g. quantum dots and carbon nanotubes) that are agglomerated resulting in poor light conversion efficiency.
Figure 3:
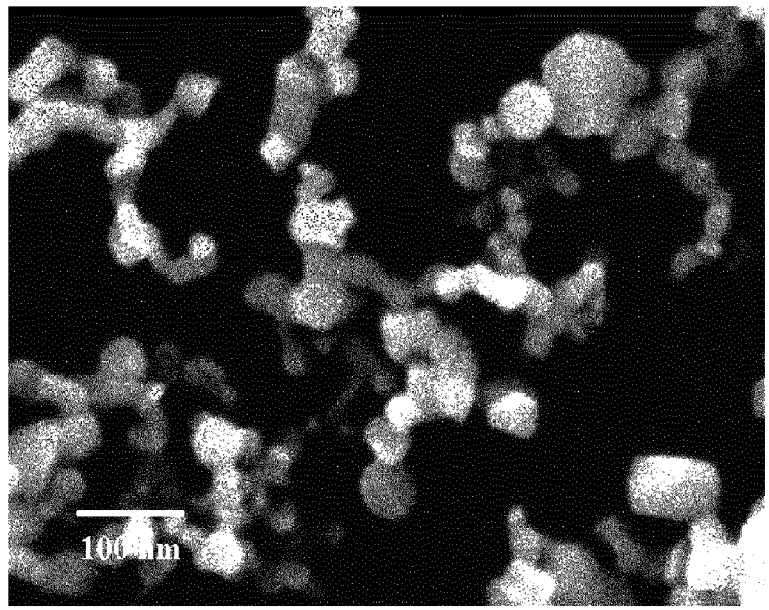
FIG. 3 is the electron scanning micrograph of FIG. 2 shown at 160,000 times magnification.
Figure 4:
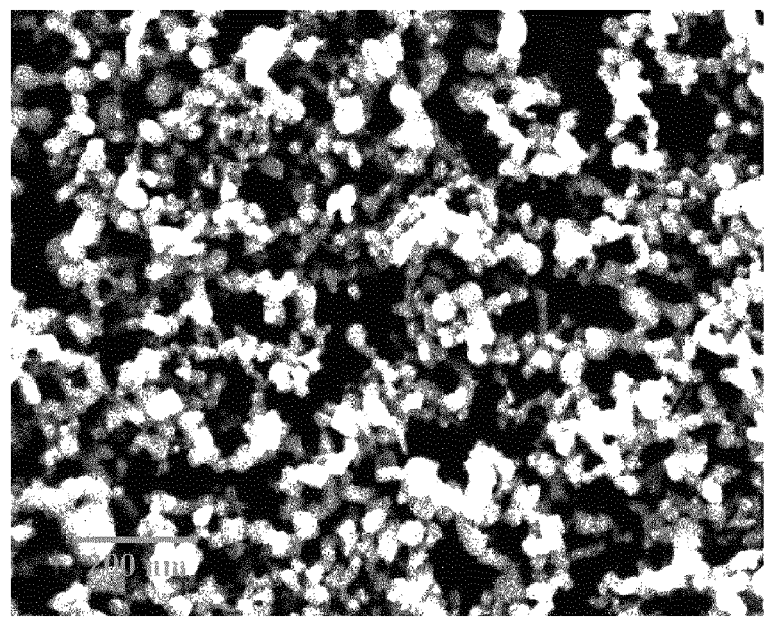
FIG. 4 is an electron scanning micrograph at 60,000 times magnification showing the instant photopolymer composition including a plurality of nanoparticles (e.g. quantum dots and carbon nanotubes) that are homogeneously dispersed in the photopolymer composition by the instant dendrimer resulting in increased light conversion efficiency.
Figure 5:
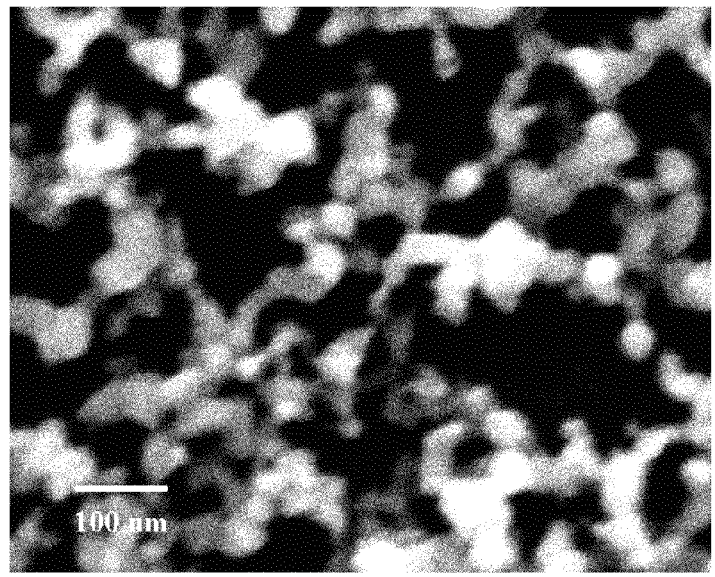
FIG. 5 is the electron scanning micrograph of FIG. 4 shown at 160,000 times magnification.

It is believed that the dendrimer interacts with (e.g. "binds") the plurality of nanoparticles through Van Der Waals attractions and homogeneously disperses the plurality of nanoparticles in the photopolymer composition (24), as shown in FIGS. 4 and 5. It is also believed that polar functional groups (e.g. hydroxyl, thiol, amine, and acid groups) of the dendrimer interact with inorganic nanoparticles and increase the efficiency of the instant invention. It is further believed that non-polar groups (e.g. carbon, aliphatic, aromatic, and cyclic groups) of the dendrimer interact with the organic photopolymer and the organic nanoparticles and also increase the efficiency of the instant invention.

It is also believed that the dendrimer reduces and potentially avoids flocculation of the plurality of nanoparticles through both steric and electrostatic repulsion. The dendrimer may form a type of envelope around the plurality of nanoparticles to more completely disperse the nanoparticles in the photopolymer composition (24) while maintaining a polymer network. Preferably, the plurality of nanoparticles are optimally dispersed in the photopolymer composition (24) while maintaining a continuous network in both organic (e.g. organic photopolymer) and inorganic (e.g. quantum dots) phases.

Most preferably, the dendrimer has similar dimensional characteristics (sizes) as the plurality of nanoparticles to maintain nano-level morphology and increase homogeneous dispersion of the plurality of nanoparticles in the photopolymer composition (24). Without intending to be bound by any particular theory, it is believed that when the sizes of the dendrimer and the nanoparticles are similar and less than 200 nanometers, as first introduced and described above, increased efficiency of the instant module (22) is achieved. It is believed that similar sizes of the dendrimer and the nanoparticles results in less steric interactions and limitations and allows the nanoparticles to be more effectively and homogeneously dispersed within the photopolymer composition (24). Typically, the organic photopolymer of the photopolymer composition (24) is not nano-sized, i.e., does not have a size less than 200 nanometers in length, width, height, or diameter.

Preferably, the chains of the dendrimer at least partially envelope the plurality of nanoparticles resulting in increased interaction, increased dispersion of the plurality of nanoparticles in the photopolymer composition (24), and increased conductivity of the photopolymer composition (24). More specifically, the polar functional groups of the dendrimer may interact with the inorganic nanoparticles while the non-polar functional groups may interact with the organic nanoparticles and the photopolymer.

In one embodiment, the dendrimer is formed by modifying a dendrimeric or hyper-branched alcohol. Suitable alcohols can be synthesized or commercially purchased from Perstorp Polyols of Perstorp, Sweden. Typically, the dendrimeric or hyper-branched alcohols are modified to add both polar and non-polar functional groups, such as those described above. One of skill in the art may adjust these modifications based on functionality of the organic photopolymer to ensure maximum compatibility between the dendrimer, the plurality of nanoparticles, and the organic photopolymer. One of skill in the art can customize addition of non-polar groups to maximize Van der Waal interactions between the plurality of nanoparticles and the dendrimer.

It is contemplated that the dendrimer may be formed by reacting pentaerythritol and one or more aromatic, cycloaliphatic and/or aliphatic anhydrides such as hexahydrophthalic anhydride, phthalic anhydride, succinic anhydride and the like, with 2,3-epoxypropyl neodecanoate, commercially available under the trade name Cardura-N. In one embodiment, the dendrimer formed by the reaction described immediately above is further reacted with additional anhydrides and extended with Cardura-N. In another embodiment, the dendrimer is modified by converting some alcohol functionalities to silyl, perfluoroalkyl, thiol, and/or thioalkyl functionalities.

Figure 13:
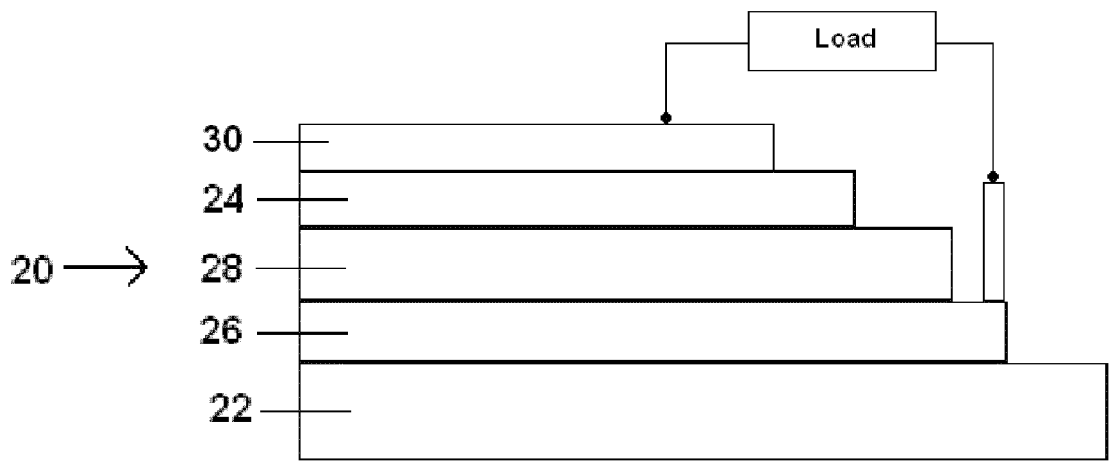
FIG. 13 is a side view of a second hybrid photovoltaic cell module of the instant invention including a plastic substrate, a conducting composition disposed on the substrate, a primer disposed on the conducting composition, the instant photopolymer composition disposed on the primer, and an electrode disposed on the photopolymer composition.
Figure 14:
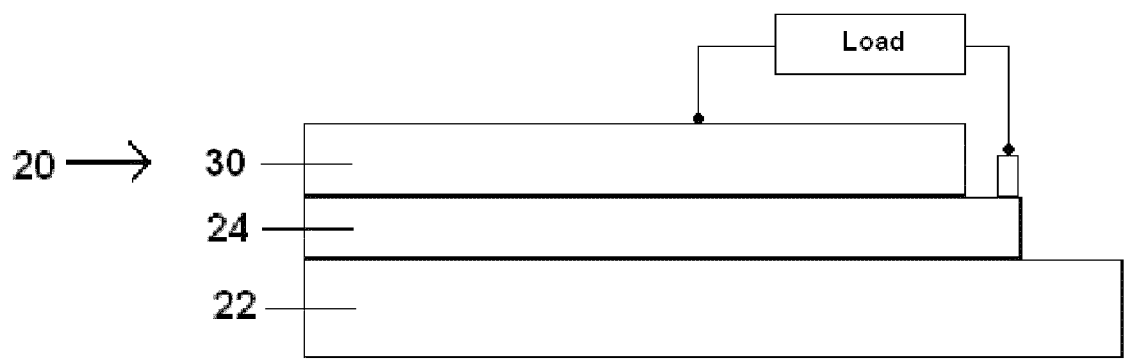
FIG. 14 is a side view of a third hybrid photovoltaic cell module of the instant invention including a substrate, the instant photopolymer composition disposed on the substrate, and an electrode disposed on the photopolymer composition.

As set forth in FIG. 13, the module (20) may include a conducting composition (26), different from the photopolymer composition (24), disposed on the substrate (22). The conducting composition (26) may be in direct or indirect contact with the substrate (22). In one embodiment, the conducting composition (26) is in direct contact with the photopolymer composition (24) and is disposed on the substrate (22). The conducting composition (26) may include any compound known in the art that is electrically conductive. In one embodiment, the conducting composition (26) includes indium tin oxide (ITO) and may be transparent, opaque, or impervious to light. It is believed that conducting compositions (26) typically have good electron hole conductivity and can be good electron donors. Thus, any electron donating material with good electron conductivity can be used in this invention as the conducting composition (26). In another embodiment, the conducting composition (26) includes one or more of carbon nanotubes (CNT) containing coatings developed by Elkos and Unidym, poly(3,4-ethylene dioxy thiophene) protected by a UV absorbing layer, a mixture of poly(3,4-ethylene dioxy thiophene) and poly(styrene sulphonate) protected by a UV absorbing layer, aluminum doped ZnO developed by Angela Balchar of MIT, and combinations thereof.

As further set forth in FIG. 13, the module (20) may also include a primer (28) disposed on the substrate (22). The primer (28) may be in direct or indirect contact with the substrate (22). In one embodiment, the primer (28) is in direct contact with the conducting composition (26) and is disposed on the substrate (22). The primer (28) may be any known in the art. In one embodiment, the primer (28) includes a copolymer of poly(3,4-ethylene dioxy thiophene) and poly(styrene sulphonate) (PEDOT:PSS). In another embodiment, the primer (28) includes the CNT containing coating described above. Typically, the primer (28) is applied to the conducting composition (26) to reduce surface imperfections and minimize electrical shorts. The primer (28) may be transparent, opaque, or impervious to light. In one embodiment, the primer (28) has a higher work function (5.0 eV) than the conducting composition (26). The higher work function may facilitate transfer of holes from a highest occupied molecular orbital of the photopolymer composition (24), e.g. poly-(3-hexylthiophene), and may improve charge transport between the photopolymer composition (24) and the conducting composition (26). In various embodiments, the dendrimer includes one or more chains bonded to an electrically conducting compound such as poly(3,4-ethylene dioxy thiophene) (PEDOT) or a polyaniline which may eliminate a need for the primer (28) and/or conducting composition (26).

The module (20) may also include an electrode (30) disposed on the substrate (22). The electrode (30) may be in direct or indirect contact with the substrate (22). In one embodiment, the electrode (30) is in direct contact with the photopolymer composition (24) and is disposed on the substrate (22). The electrode (30) may be any known in the art and preferably includes metal. Alternatively, the electrode may include organic or inorganic compounds that are conductive. In one embodiment, the electrode (30) is a closely placed bundle of nano-conductors grown on the substrate (22). These nano-conductors/electrode may tie to a single conductor for connection to an outside circuit. The electrode can be transparent, semi-transparent, or opaque.

Figure 11:
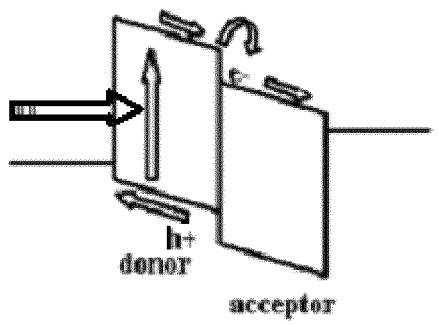
FIG. 11 illustrates light absorption, exciton dissociation, and charge transport in a photovoltaic cell of the instant invention.

Referring back to the module (20), in one embodiment, the module (20) includes a flexible plastic substrate (22) and a conducting composition (26) including ITO disposed thereon. In this embodiment, the module (20) also includes the primer (28) including poly(3,4-ethylene dioxy thiophene) and poly(styrene sulphonate) disposed on the conducting composition (26). In this embodiment, the module (20) also includes a photopolymer composition (24) including poly(3-hexylthiophene), carbon nanotubes, titanium dioxide quantum dots, and the dendrimer. Further, the module (20) also preferably includes an aluminum electrode (30) disposed on the substrate (22). Preferably, the photopolymer composition (24) is disposed within 10 nm of the substrate (22), if conductive, or within 10 nm of the conducting composition (26) to maximize exciton generation and exciton dissociation, as shown in FIG. 9 and FIG. 11. This distance is typically known as an exciton diffusion length.

Typically, electrons formed in the photopolymer along with positive holes are conducted away from those holes. In theory, it is believed that electron recombination is maximized if the exciton diffusion length (also known as percolation length) is less than 10 nm. It is also believed that a presence of carbon nanotubes inhibits electron recombination by effectively providing a path for the electrons to move away from the holes.

It is also contemplated that the module (20) may be fabricated by incorporating electrical connects to an outer circuit, to complete a loop. The photopolymer composition (24), conducting composition (26), the primer (28), and/or plurality of nanoparticles may be applied to an electrically conducting film as the substrate (22). This electrically conducting film may include a thin film of aluminum or poly(3,4-ethylene dioxy thiophene) and poly(styrene sulphonate) over ITO.

Figure 6:
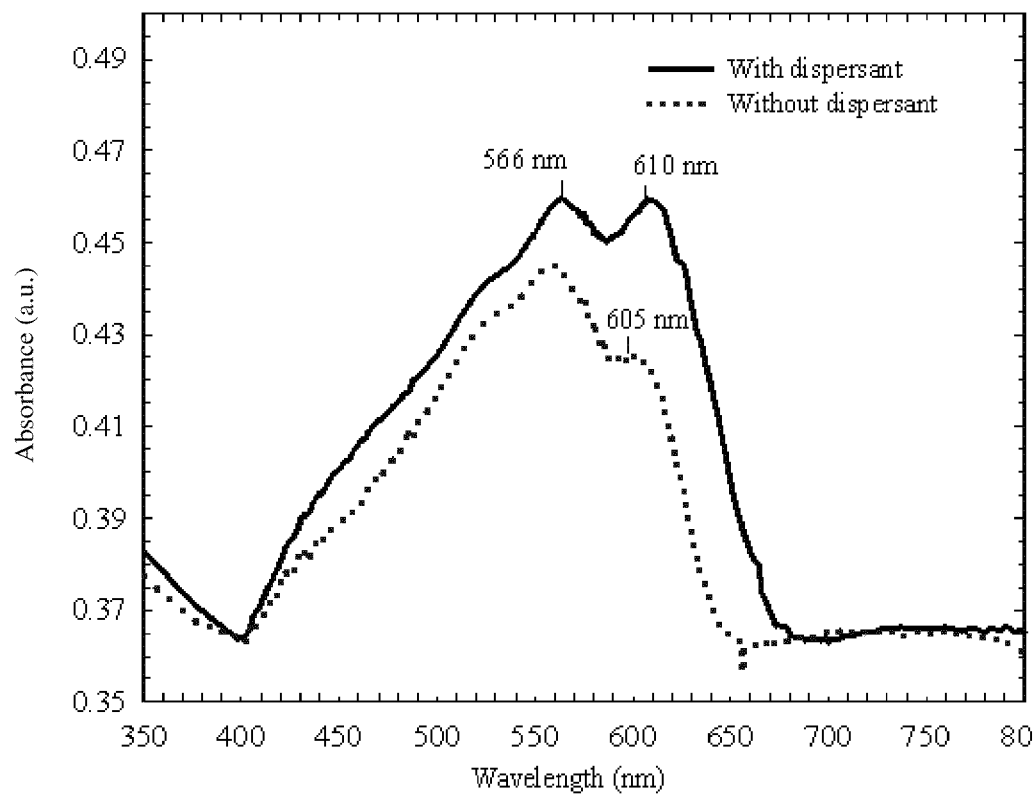
FIG. 6 is a line graph illustrating increased light absorbance (absorbance units) of the instant photopolymer composition including poly(3-hexylthiophene), titanium dioxide, and the dispersant of this invention in a weight ratio of about 1:1:0.25, as compared to the same photopolymer composition without the dendrimer, as a function of wavelength.

In one embodiment, the organic photopolymer is further defined as poly(3-hexylthiophene) and the nanoparticles include titanium dioxide. In this embodiment, the poly(3-hexylthiophene), the titanium dioxide, and the dispersant are present in a weight ratio of about 1:1:0.25. Also in this embodiment, the module (20) produces a light absorbance of from about 0.36 to 0.47 absorbance units measured at a wavelength between about 400 and 700 nanometers, wherein the light absorbance has a maximum measured at a wavelength between about 550 and 650 nanometers, and wherein the light absorbance is measured when the photopolymer composition (24) is at a thickness of about 100 micrometers on the substrate (22). Furthermore, in this embodiment, the module (20) produces a light absorbance of from about 0.45 to 0.46 absorbance units measured at a wavelength between about 550 and 650 nanometers. This evidences an ability to selectively operate modules (22) at certain wavelengths to maximize efficiency. The aforementioned light absorbance is illustrated in FIG. 6. Without intending to be bound by any particular theory, it is believed that the light absorbance illustrated in FIG. 6 represents approximately a 30% to 38% increase in efficiency of the instant invention as compared to its conventional counterpart. In various embodiments, the module (20) produces a light absorbance of from about 0.35 to 0.48, from 0.36 to 0.47, or from, 0.37 to 0.47, absorbance units measured at a wavelength between about 400 and 700 nanometers, wherein the light absorbance is measured when the photopolymer composition (24) is at a thickness of about 100 micrometers on the substrate (22).

Figure 7:
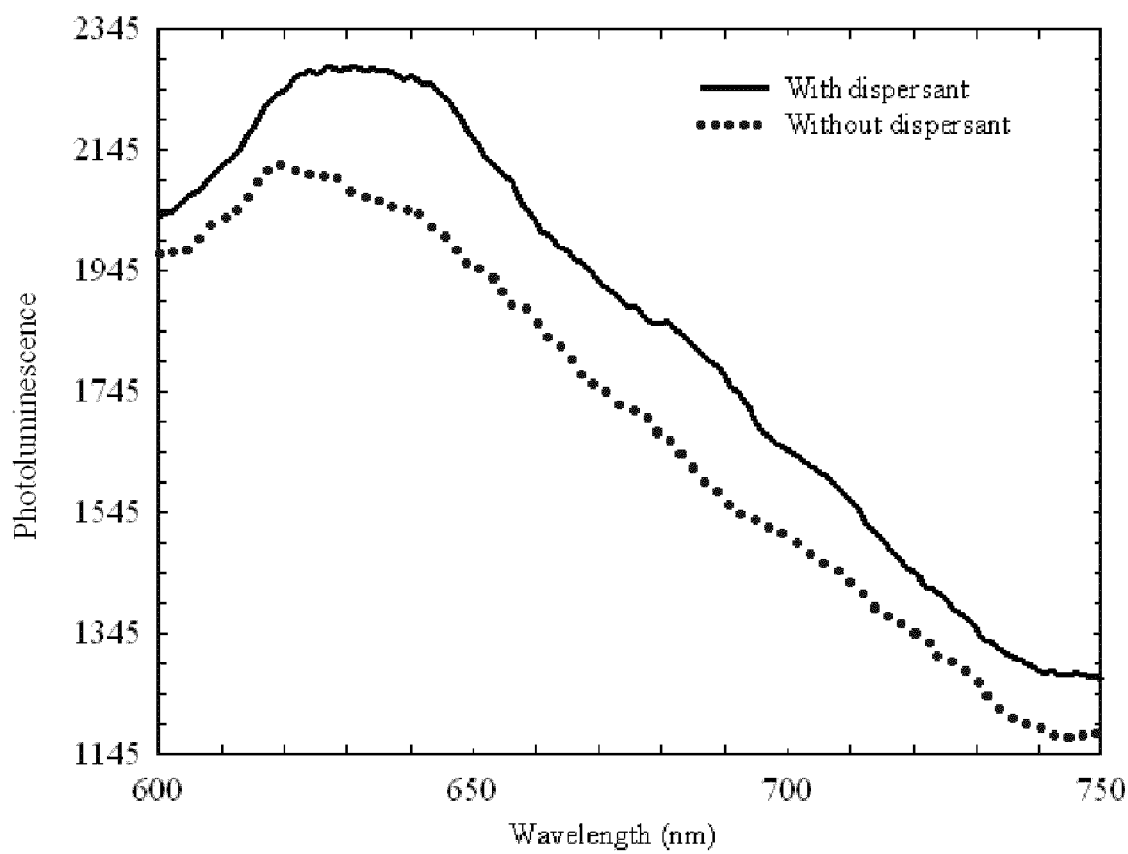
FIG. 7 is a line graph illustrating increased photoluminescence (photon counts per second) of the instant photopolymer including poly(3-hexylthiophene), titanium dioxide, and the dispersant of this invention in a weight ratio of about 1:1:0.25, as compared to the same photopolymer composition without the dendrimer, as a function of wavelength.

Also in the aforementioned embodiment, the module (20) produces a photoluminescence of from about 1275 to about 2300 photon counts per second at a wavelength between 600 and 750 nanometers. This photoluminescence is illustrated in FIG. 7. Without intending to be bound by any particular theory, it is believed that the photoluminescence illustrated in FIG. 7 represents approximately a 10 to 15% increased output in the instant invention as compared to its conventional counterpart. More specifically, an area under the curve in FIG. 7 corresponding to the instant invention is 10 to 15% greater than an area under the curve corresponding to a conventional counterpart. This increased output is believed to be indicative of increased exciton dissociation and electron transport through a network of the $TiO_2$ with minimized electron recombination with the holes in the organic photopolymer.

In other embodiments, the module (20) has a 4 to 10 percent power conversion efficiency. Power conversion efficiency is measured as a function of current input to the module (20) compared with voltage output of the same module (20), as is known in the art. In other words, power conversion efficiency is a ratio of an amount of electric power generated by the module (22) to a total amount of solar incident radiation on the module (22).

Typically, power conversion efficiency is calculated using illumination of 100 mW/cm$^2$ with an AM 1.5 solar simulator. As is known in the art, power conversion efficiency depends on three factors including open circuit voltage ($V_{oc}$) in V, short circuit current ($I_{sc}$) in mA cm$^{-2}$, and a fill factor (FF). Open circuit voltage results from built in voltage of the module (22) and is voltage across the module (22) under illumination when no current is flowing i.e., when the module (22) is in an open circuit condition. This is typically a maximum possible voltage of the module (22). Short circuit current is a current developed by the module (22) when under illumination at no load or in a short circuit condition. Fill factor is the maximum power obtained from the module (22) divided by the open circuit voltage ($V_{oc}$) and the short circuit current ($I_{sc}$). Fill factor is calculated using the following formula:

$$ff=P_{max}/(V_{oc}*I_{sc})=(V_{max}*I_{max})/V_{oc}*I_{sc}$$

wherein $P_{max}$ represents a point on an I-V curve of a module (22) under illumination wherein a product of current and voltage is at a maximum. This maximum power is denoted as $P_{max}$. Corresponding voltage and current are denoted as $V_{max}$ and $I_{max}$, respectively. Using the aforementioned values and a known solar irradiation ($P_o$), power conversion efficiency can be calculated using the following formula:

$$\eta=P_{max}/P_o*A$$

wherein A is the surface area of the module (22).

The instant invention also provides the method of forming the module (20) first introduced above. The method includes the step of disposing the photopolymer composition (24) on the substrate (22). In one embodiment, the step of disposing is further defined as disposing the photopolymer composition (24) on the substrate (22) using a printing apparatus. The printing apparatus may be an inkjet printer, a laser printer, a printing press, or any other printing apparatus known in the art. In another embodiment, the step of disposing is further defined as spraying the photopolymer composition (24) on the substrate (22). Of course, the instant invention is not limited to the aforementioned disposal techniques and may include any technique known in the art.

In another embodiment of the instant method, the photopolymer composition (24) is further defined as a film and the step of disposing the photopolymer composition (24) is further defined as applying the film to the substrate (22). In this embodiment, the step of applying the film to the substrate (22) may be further defined as melting the film on the substrate (22). Alternatively, the film may be laminated on the substrate (22).

The method may also include the steps of disposing the conducting composition (26), the primer (28), and/or the electrode (30), on the substrate (22). These steps may include disposing any or all of the conducting composition (26), the primer (28), and/or the electrode (30) in direct contact with the substrate (22). Alternatively, any or all of the conducting composition (26), the primer (28), and/or the electrode (30) may be disposed on the substrate (22) in indirect contact with the substrate (22). In various embodiments, the method includes one or more of the steps of disposing the conducting composition on the substrate, disposing the primer on the conducting composition, and/or disposing the electrode on the photopolymer composition.

The step of disposing the photopolymer composition (24), and/or the steps of disposing the conducting composition (26), the primer (28), and/or the electrode (30) on any other layer may be completed by any means known in the art including, but not limited to, spin coating, brush coating, spray coating, knife coating, and combinations thereof. The photopolymer composition (24) may be disposed on the substrate (22) in solid, liquid, or gaseous form. The conducting composition (26) and the primer (28) may also be disposed on the substrate (22) in solid, liquid, or gaseous form. The photopolymer composition (24), conducting composition (26), the primer (28), and/or the electrode (30) may be disposed on the substrate (22) by chemical means, mechanical means, or through a combination of both chemical and mechanical means. More specifically, any or all of the photopolymer composition (24), conducting composition (26), the primer (28), and/or the electrode (30) may be disposed on the substrate (22) as a matrix of dots using a printer. These dots may be applied over a thin film of aluminum over which another matrix of conducting dots are applied. The dots may be connected by thin (nano-wide) wires which are connected in parallel at one end. It is also contemplated that any of the photopolymer composition (24), conducting composition (26), the primer (28), and/or the electrode (30) may be encapsulated either partially or totally by another other portion of the module (20). In one embodiment, the method includes the step of disposing the electrode on the photopolymer composition via chemical vapor deposition. The method may further include the step of applying a second photopolymer composition to the substrate (22) and/or applying a second substrate to the substrate.

EXAMPLES

Formation of the Instant Invention

A hybrid photovoltaic cell module (Module 1) is formed according to the instant invention. Module 1 includes a substrate (22) and a conducting composition (26) disposed on the substrate (22) as shown in FIG. 13. More specifically, the substrate (22) is a 25 mm×25 mm square glass (SiO$_2$) sheet that includes a 150-200 nm thick coating of the conducting composition (26) disposed thereon. The conducting composition (26) includes indium tin oxide (ITO). The substrate (22) and conducting composition (26) have a sheet resistance of approximately 8-12 Ohm. The substrate (22) including the conducting composition (26) disposed thereon is commercially available from Delta Technologies of North-Stillwater, Minn.

Before the substrate (22) is used to form Module 1, the substrate (22) is immersed in an acetone bath for 10 minutes and then dried in a stream of nitrogen. Subsequently, the substrate (22) is immersed in an isopropyl alcohol (IPA) and/or ethanol bath for 10 minutes, washed with deionized water, and again dried in a stream of nitrogen.

In addition to the substrate (22), Module 1 also includes a primer (28) including poly(3,4-ethylene dioxy thiophene) and poly(styrene sulphonate) disposed on the substrate (22). The primer (28) is in direct contact with the conducting composition (26) as shown in FIG. 13. The poly(3,4-ethylene dioxy thiophene) and poly(styrene sulphonate) are spun at 3000 RPM for 60 seconds to form the primer (28) on the conducting composition (26). After spin coating, the primer (28) is baked for 2 hours at 100° C. in a vacuum oven. The poly(3,4-ethylene dioxy thiophene) and poly(styrene sulphonate) are commercially available from Sigma-Aldrich of Allentown, Pa. Without intending to be bound by any particular theory, it is believed that the primer (28) smoothes the conducting composition (26) thereby reducing a chance of a short circuit between positive and negative electrodes and also has a higher work function (5.0 eV) than the conducting composition (26). It is also believed that the higher work function facilitates transfer of holes from the highest occupied molecular orbital of the poly-(3-hexylthiophene), described in detail below, and improves charge transport between the poly-(3-hexylthiophene) and the indium tin oxide.

Module 1 also includes a photopolymer composition (24) disposed on the substrate (22) and in direct contact with the primer (28) as shown in FIG. 13. More specifically, the photopolymer composition (24) is disposed on the substrate (22) and in direct contact with the primer (28) by spin coating at 100 rpm for 30 seconds and then at 2000 rpm for 45 seconds. After spin coating, the photopolymer composition (24) is allowed to dry for 24 hours at room temperature under vacuum. The photopolymer composition (24) of Module 1 includes poly-(3-hexylthiophene) mixed with TiO$_2$ and a dendrimer. The poly-(3-hexylthiophene) is available from Plextronics of Pittsburgh, Pa. and has a molecular weight of 15,000-20,000 g/mol. The poly-(3-hexylthiophene) is readily soluble in most organic solvents and has a typical mobility of 0.1 cm$^2$/Vs. The TiO$_2$ is a 30 nm TiO$_2$ powder commercially available from MTI Corp of Richmond, Calif., is 99.5% pure with crystalline structure, is 99.99% rutile, and is manufactured by a SOL-GEL process.

In addition, Module 1 also includes an electrode (30) disposed on the substrate (22) and in direct contact with the photopolymer composition (24), as shown in FIG. 13. The electrode (30) includes aluminum (Al) that is vacuum evaporated on the top of the photopolymer composition (24) for external connection.

Preparation of the Photopolymer Composition (24):

As set forth above, the photopolymer composition (24) includes poly-(3-hexylthiophene) mixed with TiO$_2$ and the dendrimer.

Preparation of the poly-(3-hexylthiophene) mixed with TiO$_2$

The poly-(3-hexylthiophene) is mixed with the TiO$_2$ in 1:1 ratio by weight with xylene as a solvent to form a mixture. The mixture is maintained at a temperature of about 50° C. in a temperature bath and continuously stirred using an ultrasonicator. Subsequently, the mixture is divided into a first part and a second part. An amount of the dendrimer of the instant invention, described in detail below, is introduced into the first part with continuous stirring. The final weight ratio of the first part is 1:1:0.25 of poly-(3-hexylthiophene) to TiO$_2$ to dendrimer. The second part is then recombined with the first part to form photopolymer composition (24).

Preparation of the Dendrimer:

The dendrimer is formed by reacting pentaerythritol (molecular weight=136 g/mol) and hexahydropthalic anhydride (molecular weight=154 g/mol) over one hour in a ratio of 1:3, in a solvent of ethyl methyl ketone (2-butanone), and at a temperature of from 130-140° C. The temperature is maintained using a constant temperature bath of mineral oil. Reaction of the pentaerythritol and hexahydropthalic anhydride is exothermic and small amounts of toluene are typically added to control the exotherm. After one hour, three moles of 2,3-epoxypropyl neodecanoate (eq. wt.=250) are added to form the dendrimer and the exotherm is kept at or below 150° C. The pentaerythritol, hexahydropthalic anhydride and 2-butanone are commercially available from Sigma-Aldrich, Allentown, Pa. The 2,3-epoxypropyl neodecanoate is commercially available from Hexion Specialty Chemicals Inc. of Pueblo, Colo. under the trade name of Cardura-N.

Formation of Comparative Example:

In addition to Module 1, a comparative module (Comparative Module 1) is also formed but not according to the instant invention. Comparative Module 1 is formed in exactly the same way as Module 1. However, the photopolymer composition used to form Comparative Module 1 does not include the dendrimer of the instant invention.

Analysis of Module 1 and Comparative Module 1:

After formation of Module 1 and Comparative Module 1, each is tested to determine an amount of dispersion of the TiO$_2$ in the photopolymer composition using a scanning electron microscope commercially available under the trade name JEOL JSM-6380LV, having a magnification range from 150 to 270,000, and scanning from 500 μm to 50 nm. The scanning electron microscopy images are set forth in FIGS. 2-5.

Both Module 1 and Comparative Module 1 are also tested to determine absorption measurements of the photopolymer compositions using an Agilent 8453 spectrophotometer. For reference, absorption measurements are taken of the glass substrate by itself. To process the absorption measurements, UV-Visible Chemstation software is used. The results of the absorption measurements are shown in FIG. 6 wherein the light absorbance is measured when the photopolymer composition is at a thickness of about 100 micrometers on the glass substrate.

In FIG. 6, the absorption spectrum for Module 1 includes two peaks, one at 566 nm and other at 610 nm. The absorption spectrum for Comparative Module 1 includes a single peak at 560 nm and a shoulder at 605 nm. Thus, these measurements indicate that through use of the dendrimer of this invention, the absorption spectra is broadened towards longer wavelengths and that inter-band absorption is increased, thereby increasing efficiency of Module 1.

As shown in FIGS. 2-5, the scanning electron microscopy reveals structural morphology and improved distribution and ordering of both the TiO$_2$ and the poly-(3-hexylthiophene)

polymer in Module 1 as compared to Comparative Module 1. More specifically, the scanning electron microscopy indicates that the dendrimer of this invention increases the dispersion of the TiO$_2$ in the photopolymer composition in Module 1 as compared to the TiO$_2$ in the photopolymer composition without the dendrimer in Comparative Module 1. Without intending to be limited by theory, it is believed that this increased dispersion contributes to the increased efficiency of Module 1.

Overall, the scanning electron microscopy results provide information about improved interface areas and better networks while the absorption data indicates increased absorption by the photopolymer composition of Module 1. When taken together, the data indicate improved exciton dissociation and charge transport and reduced exciton recombination.

Without intending to be bound by any particular theory, it is believed that the absorption of Module 1 can be attributed, at least in part, to distribution and interaction between the TiO$_2$ and the poly-(3-hexylthiophene)polymer. It is believed that the presence of the TiO$_2$ lowers the poly-(3-hexylthiophene)polymer absorption due to a disordered matrix. Inclusion of the dendrimer of this invention increases overall absorbance and produces more pronounced absorbance peaks in Module 1 as compared to Comparative Module 1. It is believed that the absorbance peaks result from II-II* transitions indicating improved exciton formation and ordering of the photopolymer composition. It is also believed that increased inter-band absorption in Module 1 is indicative of improved ordering of the photopolymer composition. Improved ordering is thought to maintain interactions among polymer chains and improve absorption effectiveness. Still further, the broadening of the absorption spectra towards longer wavelengths in Module 1 is also though to indicate improved ordering of the photopolymer composition due to enhanced conjugation length and a shift of the absorption spectrum to lower energies.

Additionally, both Module 1 and Comparative Module 1 are tested to determine photoluminescence measurements of the photopolymer composition using a FluoroMax-3 spectrofluorometer with excitation source of wavelength 550 nm. The results of the photoluminescence measurements are shown in FIG. 7.

The photoluminescence measurements are useful to evaluate a degree of exciton dissociation, an amount of exciton recombination, and an extent of charge transport. As is known in the art, excited electrons return to a ground state and emit energy in the form of radiation. As is also known in the art, dissociated electrons can recombine with adjacent holes due to inefficient charge transport and lost the radiation. The radiation can be detected using photoluminescence.

As shown in FIG. 7, the photoluminescence measurements indicate an increase of photoluminescence in Module 1 as compared to Comparative Module 1 due to improved exciton dissociation and electron transport through a network of the TiO$_2$ with minimized electron recombination with the holes in the photopolymer composition. It is believed that this increase is further indicative of the increased efficiency of Module 1.

The invention has been described in an illustrative manner, and it is to be understood that the terminology which has been used is intended to be in the nature of words of description rather than of limitation. Obviously, many modifications and variations of the present invention are possible in light of the above teachings, and the invention may be practiced otherwise than as specifically described.

What is claimed is:

1. A hybrid photovoltaic cell module comprising:
   A. a substrate; and
   B. a photopolymer composition disposed on said substrate and comprising;
      (1) an organic photopolymer,
      (2) a plurality of nanoparticles, and
      (3) a dendrimer for dispersing said plurality of nanoparticles in said photopolymer composition, wherein said dendrimer has a number average molecular weight of from 300 to 10,000 g/mol and has a core having the general formula:

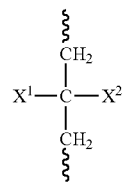

wherein X$^1$ is a hydrogen atom, a functional group, or a chain comprising a functional group;
wherein X$^2$ is a chain comprising a functional group that is the same or different from said functional groups of X$^1$; and
wherein each —CH$_2$ group is bonded to a chain and each chain independently comprises a functional group that is the same or different from said functional groups of X$^1$ and X$^2$.

2. A hybrid photovoltaic cell module as set forth in claim 1 wherein said dendrimer is free of covalent bonds to a fullerene.

3. A hybrid photovoltaic cell module as set forth in claim 1 wherein said functional group of each chain bonded to said —CH$_2$ groups is independently selected from the group of an aliphatic functional group having at least 4 carbon atoms, an alcohol functional group, and an ester functional group.

4. A hybrid photovoltaic cell as set forth in claim 3 wherein said functional group of X$^2$ is selected from the group of an aliphatic functional group having at least 4 carbon atoms, an alcohol functional group, and an ester functional group.

5. A hybrid photovoltaic cell as set forth in claim 3 wherein said functional group of X$^2$ is selected from the group of a nitrogen-containing functional group, a phosphorous-containing functional group, a sulfur-containing functional group, and an oxygen-containing functional group.

6. A hybrid photovoltaic cell as set forth in claim 4 wherein X$^2$ further comprises two additional functional groups which are each the same or different from said functional group of X$^2$, and wherein each of said two additional functional groups are independently selected from the group of an aliphatic functional group having at least 4 carbon atoms, an alcohol functional group, and an ester functional group.

7. A hybrid photovoltaic cell as set forth in claim 6 wherein X$^1$ is said chain and said functional group of said chain is selected from the group of an aliphatic functional group having at least 4 carbon atoms, an alcohol functional group, and an ester functional group.

8. A hybrid photovoltaic cell as set forth in claim 7 wherein said chain further comprises two additional functional groups which are each the same or different from said functional groups of X$^1$ and wherein each of said two additional functional groups are independently selected from the group of an aliphatic functional group having at least 4 carbon atoms, an alcohol functional group, and an ester functional group.

9. A hybrid photovoltaic cell as set forth in claim 1 wherein X$^1$ is said chain and said functional group of said chain is selected from the group of an aliphatic functional group having at least 4 carbon atoms, an alcohol functional group, and an ester functional group.

10. A hybrid photovoltaic cell as set forth in claim 9 wherein said chain further comprises two additional functional groups which are each the same or different from said functional groups of $X^1$ and wherein each of said two additional functional groups are independently selected from the group of an aliphatic functional group having at least 4 carbon atoms, an alcohol functional group, and an ester functional group.

11. A hybrid photovoltaic cell module as set forth in claim 1 wherein each —$CH_2$ group is directly bonded to an oxygen atom.

12. A hybrid photovoltaic cell module as set forth in claim 1 wherein each —$CH_2$ group is directly bonded to an oxygen atom and $X^2$ comprises a —$CH_2$—O group directly bonded to the central carbon atom of said core.

13. A hybrid photovoltaic cell module as set forth in claim 12 wherein $X^1$ is said chain and said chain comprises a —$CH_2$—O group directly bonded to the central carbon atom of said core.

14. A hybrid photovoltaic cell module as set forth in claim 1 wherein $X^1$ is said chain and said chain comprises a —$CH_2$—O group directly bonded to the central carbon atom of said core.

15. A hybrid photovoltaic cell module as set forth in claim 1 wherein at least one of said chains bonded to said —$CH_2$ groups has the general chemical structure:

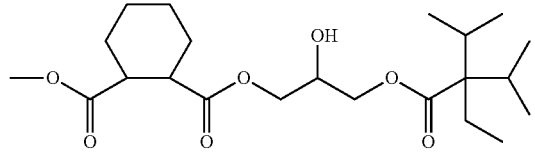

16. A hybrid photovoltaic cell module as set forth in claim 1 wherein both chains bonded to said —$CH_2$ groups have the general chemical structure:

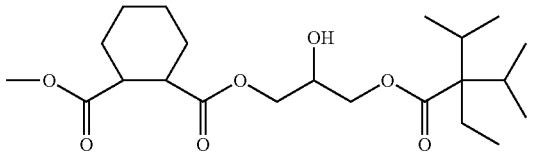

17. A hybrid photovoltaic cell module as set forth in claim 16 wherein $X^2$ has the general chemical structure:

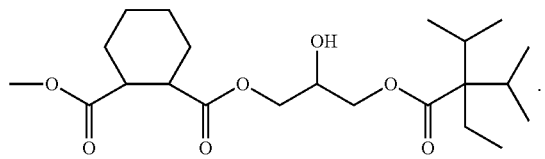 [SMILES: CCC(C(=O)OCC(O)COC(=O)C1CCCCC1C(=O)OC)(C(C)C)C(C)C]

18. A hybrid photovoltaic cell module as set forth in claim 1 wherein $X^2$ has the general chemical structure:

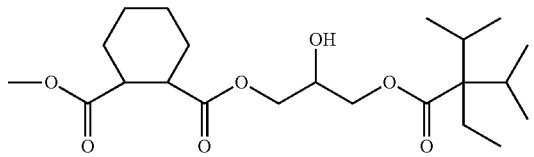

19. A hybrid photovoltaic cell module as set forth in claim 1 wherein said dendrimer has the general chemical structure:

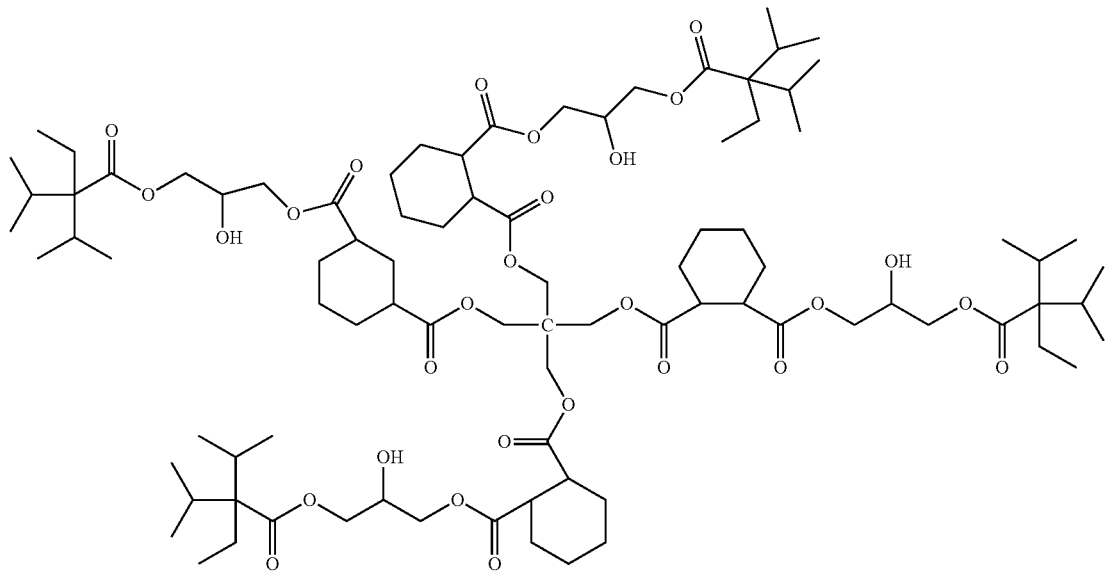

20. A hybrid photovoltaic cell as set forth in claim 19 wherein said dendrimer is present in said photopolymer composition in a ratio of from 0.05:1 to 1:1 of said dendrimer to said organic photopolymer.

21. A hybrid photovoltaic cell as set forth in claim 1 wherein said dendrimer is present in said photopolymer composition in a ratio of from 0.05:1 to 1:1 of said dendrimer to said organic photopolymer.

22. A hybrid photovoltaic cell module as set forth in claim 1 wherein said nanoparticles comprise inorganic nanoparticles selected from the group of titanium dioxide, cadmium sulfide, cadmium selenide, cadmium telluride, and combinations thereof.

23. A hybrid photovoltaic cell module as set forth in claim 1 wherein said nanoparticles comprise carbon nanotubes.

24. A hybrid photovoltaic cell module as set forth in claim 1 wherein said substrate comprises a plastic.

25. A hybrid photovoltaic cell module as set forth in claim 24 further comprising:
   A. a conducting composition disposed on and in direct contact with said substrate;
   B. a primer comprising disposed on and in direct contact with said conducting composition; and
   C. an electrode,
   wherein said photopolymer composition is disposed on and in direct contact with said primer and said electrode is disposed on and in direct contact with said photopolymer composition.

26. A hybrid photovoltaic cell as set forth in claim 25 wherein said conducting composition comprises one or more of indium tin oxide, carbon nanotubes comprising a coating, poly(3,4-ethylene dioxy thiophene) comprising a UV absorbing layer, a mixture of poly(3,4-ethylene dioxy thiophene) and poly(styrene sulphonate) comprising a UV absorbing layer, aluminum doped zinc oxide, and combinations thereof.

27. A hybrid photovoltaic cell module as set forth in claim 26 wherein said organic photopolymer is selected from the group of poly(3-octylthiophene), poly(phenylenevinylene), poly(3-hexylthiophene), polyanilines, and combinations thereof, and wherein said dendrimer has the general chemical structure:

28. A hybrid photovoltaic cell module as set forth in claim 27 wherein said organic photopolymer is further defined as poly(3-hexylthiophene) and said nanoparticles comprise titanium dioxide, wherein said poly(3-hexylthiophene), said titanium dioxide, and said dispersant are present in a weight ratio of about 1:1:0.25, wherein said module produces a light absorbance of from between about 0.36 and 0.47 absorbance units measured at a wavelength between about 400 and 700 nanometers, wherein the light absorbance has a maximum measured at a wavelength between about 550 and 650 nanometers, and wherein the light absorbance is measured when said photopolymer composition is at a thickness of about 100 micrometers on said substrate.

29. A hybrid photovoltaic cell module as set forth in claim 28 that produces a photoluminescence of from between about 1275 and 2300 photon counts per second at a wavelength between 600 and 750 nanometers.

30. A hybrid photovoltaic cell module as set forth in claim 28 that has a 4 to 10 percent power conversion efficiency calculated according to the formula $\eta = P_{max}/P_o * A$, wherein $P_{max}$ is a maximum power of said module, $P_o$ is total solar irradiation striking said module, and A is a surface area of said module.

31. A hybrid photovoltaic cell module as set forth in claim 1 wherein said organic photopolymer, said nanoparticles, and said dispersant are present in a weight ratio of about 1:1:0.25, wherein said module produces a light absorbance of from between about 0.36 and 0.47 absorbance units measured at a wavelength between about 400 and 700 nanometers, wherein the light absorbance has a maximum measured at a wavelength between about 550 and 650 nanometers, and wherein the light absorbance is measured when said photopolymer composition is at a thickness of about 100 micrometers on said substrate.

32. A method of forming a hybrid photovoltaic cell module comprising a substrate and a photopolymer composition disposed on the substrate, said method comprising the step of disposing the photopolymer composition on the substrate, wherein the photopolymer composition comprises:
   (1) an organic photopolymer,
   (2) a plurality of nanoparticles, and

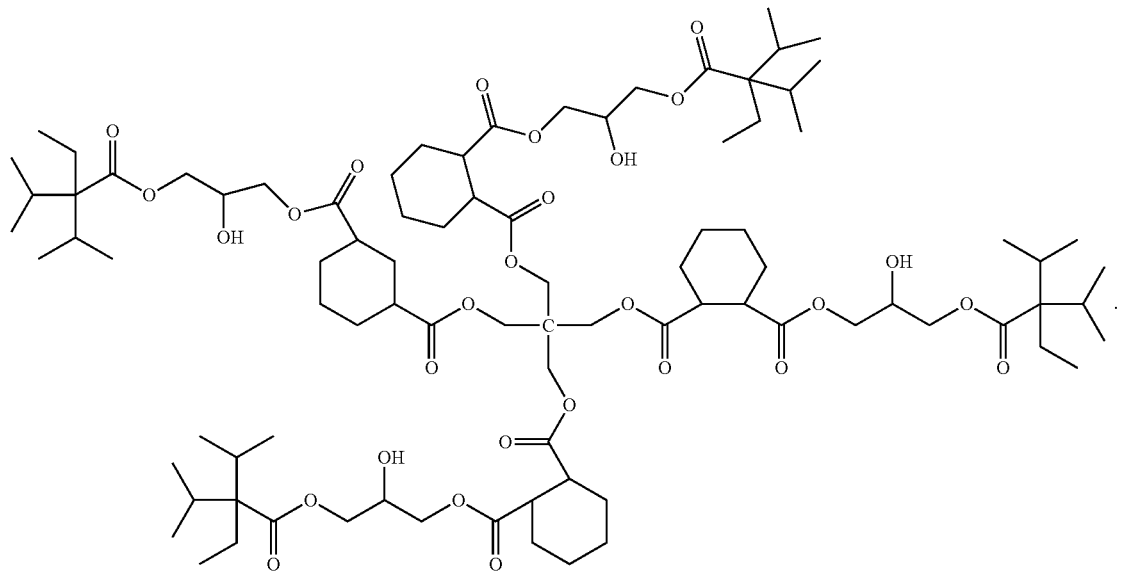 [SMILES: CCC(C(=O)OCC(O)COC(=O)C1CCCC(C(=O)OCC(COC(=O)C2CCCCC2C(=O)OCC(O)COC(=O)C(CC)(C(C)C)C(C)C)(COC(=O)C2CCCCC2C(=O)OCC(O)COC(=O)C(CC)(C(C)C)C(C)C)COC(=O)C2CCCCC2C(=O)OCC(O)COC(=O)C(CC)(C(C)C)C(C)C)C1)(C(C)C)C(C)C]

(3) a dendrimer for dispersing the plurality of nanoparticles in the photopolymer composition, wherein the dendrimer has a number average weight of from 300 to 10,000 g/mol and a core having the general formula:

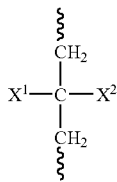

wherein $X^1$ is a hydrogen atom, a functional group or a chain comprising a functional group;

wherein $X^2$ is a chain comprising a functional group that is the same or different from the functional groups of $X^1$; and wherein each —$CH_2$ group is bonded to a chain and each chain independently comprises a functional group that is the same or different from the functional groups of $X^1$ and $X^2$.

33. A method as set forth in claim 32 wherein the dendrimer is free of covalent bonds to a fullerene.

34. A method as set forth in claim 32 wherein at least one of the chains bonded to the —$CH_2$ groups has the general chemical structure:

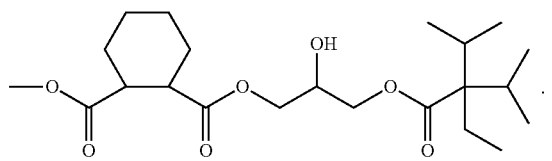 [SMILES: CCC(C(=O)OCC(O)COC(=O)C1CCCCC1C(=O)OC)(C(C)C)C(C)C]

35. A method as set forth in claim 32 wherein the dendrimer has the general chemical structure:

36. A method as set forth in claim 35 wherein the step of disposing is further defined as disposing the photopolymer composition on the substrate using a printing apparatus.

37. A method as set forth in claim 35 wherein the step of disposing is further defined as spraying the photopolymer composition on the substrate.

38. A method as set forth in claim 35 wherein the hybrid photovoltaic cell module further comprises an electrode disposed on the photopolymer composition and the method further comprises the step of disposing the electrode on the photopolymer composition via chemical vapor deposition.

39. A method as set forth in claim 35 wherein the hybrid photovoltaic cell module further comprises a conducting composition disposed on and in direct contact with said substrate, a primer disposed on and in direct contact with said conducting composition, and an electrode, wherein the photopolymer composition is disposed on and in direct contact with the primer and said electrode is disposed on and in direct contact with said photopolymer composition, wherein the step of disposing the photopolymer composition is further defined as disposing the photopolymer composition on the primer, and wherein the method further comprises the steps of:

A. disposing the conducting composition on the substrate;
B. disposing the primer on the conducting composition; and
C. disposing the electrode on the photopolymer composition.

40. A hybrid photovoltaic cell module comprising:
A. a substrate; and
B. a photopolymer composition disposed on said substrate and comprising;
(1) an organic photopolymer,
(2) a plurality of nanoparticles, and
(3) a dendrimer for dispersing said plurality of nanoparticles in said photopolymer composition, wherein said dendrimer has a number average molecular weight of from 300 to 10,000 g/mol, a polydispersity of from 1 to 1.2, and a core having the general formula:

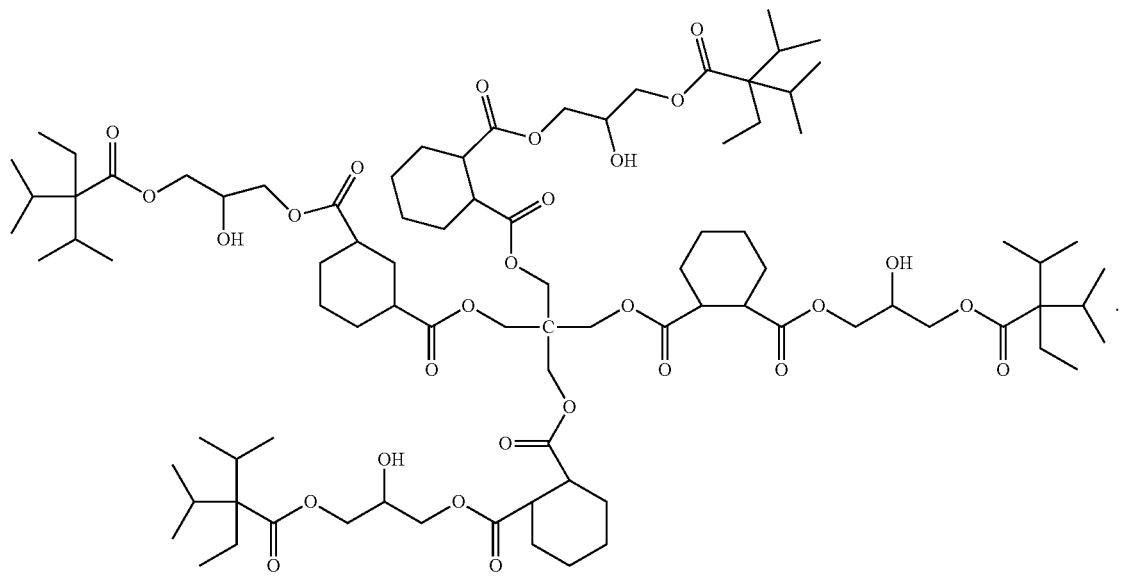

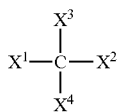

wherein each of $X^1$ to $X^4$ is independently a hydrogen atom, a functional group, or a chain comprising one or more functional groups that may be the same or different from each other.

41. A hybrid photovoltaic cell module as set forth in claim 40 wherein said dendrimer has a size of from 10 to 200 nanometers.

42. A hybrid photovoltaic cell module comprising:
A. a substrate; and
B. a photopolymer composition disposed on said substrate and comprising;
   (1) an organic photopolymer,
   (2) a plurality of nanoparticles, and
   (3) a dendrimer for dispersing said plurality of nanoparticles in said photopolymer composition, wherein said dendrimer has a number average molecular weight of from 300 to 10,000 g/mol and has a core having the general formula:

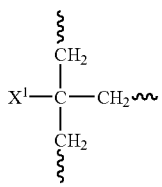

wherein $X^1$ is a hydrogen atom, a functional group, or a chain comprising a functional group; and wherein each —$CH_2$ group is bonded to a chain and each chain independently comprises a functional group that is the same or different from said functional groups of $X^1$.

43. A hybrid photovoltaic cell module as set forth in claim 42 wherein said dendrimer is free of covalent bonds to a fullerene.

44. A hybrid photovoltaic cell module as set forth in claim 42 wherein said functional group of each chain bonded to said —$CH_2$ groups is independently selected from the group of an aliphatic functional group having at least 4 carbon atoms, an alcohol functional group, and an ester functional group.

45. A hybrid photovoltaic cell as set forth in claim 42 wherein $X^1$ is said chain and said functional group of said chain is selected from the group of an aliphatic functional group having at least 4 carbon atoms, an alcohol functional group, and an ester functional group.

46. A hybrid photovoltaic cell as set forth in claim 45 wherein said chain further comprises two additional functional groups which are each the same or different from the functional groups of $X^1$ and wherein each of said two additional functional groups are independently selected from the group of an aliphatic functional group having at least 4 carbon atoms, an alcohol functional group, and an ester functional group.

* * * * *